«12» United States Patent
Oide et al.

«10» Patent No.: US 11,256,473 B2
«45» Date of Patent: Feb. 22, 2022

«54» INFORMATION PROCESSING DEVICE, INFORMATION PROCESSING METHOD, AND PROGRAM

«71» Applicant: SONY CORPORATION, Tokyo (JP)

«72» Inventors: Kenichi Oide, Tokyo (JP); Takayuki Mizuuchi, Chiba (JP); Osamu Nishida, Tokyo (JP); Hirohisa Shibuya, Tokyo (JP); Taeko Usui, Saitama (JP); Taisuke Nakazono, Kanagawa (JP)

«73» Assignee: SONY CORPORATION, Tokyo (JP)

«*» Notice: Subject to any disclaimer, the term of this patent is extended or adjusted under 35 U.S.C. 154(b) by 0 days.

«21» Appl. No.: 17/028,236

«22» Filed: Sep. 22, 2020

«65» Prior Publication Data

US 2021/0004203 A1  Jan. 7, 2021

Related U.S. Application Data

«63» Continuation of application No. 16/333,742, filed as application No. PCT/JP2017/028896 on Aug. 9, 2017, now Pat. No. 10,809,972.

«30» Foreign Application Priority Data

Sep. 27, 2016  (JP) .................. 2016-187824
Dec. 8, 2016  (JP) .................. 2016-238205

«51» Int. Cl.
G06F 3/16  (2006.01)
G06N 20/00  (2019.01)
H04R 29/00  (2006.01)

«52» U.S. Cl.
CPC ............. *G06F 3/165* (2013.01); *G06N 20/00* (2019.01); *H04R 29/001* (2013.01)

«58» Field of Classification Search
CPC ........ H04R 29/001; G06F 3/165; G06N 20/00
(Continued)

«56» References Cited

U.S. PATENT DOCUMENTS 8,285,344 B2 * 10/2012 Kahn ....................... H03G 3/32
381/57

FOREIGN PATENT DOCUMENTS

CN  101789998  7/2010
JP  2015-130659  7/2015
(Continued)

OTHER PUBLICATIONS

Gehlin, "Feedforward Active Noise Control Technique: Meeting Actual Demand of Wired Earphone Design," Electronic Today, Jun. 30, 2015, pp. 36-39.

(Continued)

*Primary Examiner* — Paul Kim
«74» *Attorney, Agent, or Firm* — Sheridan Ross P.C.

«57» ABSTRACT

To enable listening to audio in a more suitable mode without any complicated operation even in a situation in which the user's state or situation successively changes. An information processing device including: a recognition processing unit that recognizes a user's state in accordance with a detection result of a predetermined state or situation; and an output control unit that controls audio output from a predetermined output unit on the basis of a function map, which is selected in accordance with a predetermined condition, in which a setting related to control of the audio output is associated with each of a plurality of candidates for the user's state, and the recognized user's state.

20 Claims, 24 Drawing Sheets

(58) Field of Classification Search
USPC .......................................................... 381/58
See application file for complete search history.

(56) References Cited

FOREIGN PATENT DOCUMENTS

| | | |
|---|---|---|
| WO | WO 2008/076517 | 6/2008 |
| WO | WO 2015/186387 | 12/2015 |

OTHER PUBLICATIONS

Zhang et al., "Reduction in Time-to-Sleep through EEG Based Brain State Detection and Audio Stimulation," Annual International Conference of the IEEE Engineering in Medicine and Biology Society, Aug. 2015, pp. 8050-8053.
Official Action for Japan Patent Application No. 2018-541971, dated Jul. 27, 2021, 10 pages.

* cited by examiner

FIG. 5

|  | Stay | Walk | Run | Vehicle | Bicycle |
|---|---|---|---|---|---|
| NOISE REDUCTION | ON | OFF | OFF | ON | OFF |
| AMBIENT | OFF | ON | ON | OFF | — |
| REPRODUCTION OF MUSIC | ON | ON | ON | ON | — |
| VOLUME OF MUSIC | VOLUME REDUCTION (−10dB) | RETURN TO REFERENCE | RETURN TO REFERENCE | RETURN TO REFERENCE | — |

FIG. 9

| | Stay | Walk | Run | Vehicle | Bicycle |
|---|---|---|---|---|---|
| NOISE REDUCTION | TAKE OVER PREVIOUS STATE | OFF | OFF | ON | TAKE OVER PREVIOUS STATE |
| AMBIENT | TAKE OVER PREVIOUS STATE | ON | ON | OFF | TAKE OVER PREVIOUS STATE |
| REPRODUCTION OF MUSIC | TAKE OVER PREVIOUS STATE | ON | ON | ON | TAKE OVER PREVIOUS STATE |
| VOLUME OF MUSIC | TAKE OVER PREVIOUS STATE | — | — | — | TAKE OVER PREVIOUS STATE |

FIG. 18

| | | Stay | Long Stay | Walk | Run | Vehicle | Bicycle |
|---|---|---|---|---|---|---|---|
| ACTION SCENARIO A | NOISE REDUCTION | NO CHANGE | | OFF | OFF | ON | |
| | AMBIENT | NO CHANGE | | Normal 60% | Normal 100% | OFF | |
| | REPRODUCTION OF MUSIC | NO CHANGE | | NO CHANGE | NO CHANGE | NO CHANGE | |
| | VOLUME OF MUSIC | RETURN REDUCED VOLUME | | RETURN REDUCED VOLUME | SMALL VOLUME | RETURN REDUCED VOLUME | |
| ACTION SCENARIO B | NOISE REDUCTION | NO CHANGE | ON | OFF | OFF | | |
| | AMBIENT | NO CHANGE | OFF | Normal 60% | Normal 100% | | |
| | REPRODUCTION OF MUSIC | NO CHANGE | NO CHANGE | NO CHANGE | NO CHANGE | | |
| | VOLUME OF MUSIC | NO CHANGE | NO CHANGE | NO CHANGE | NO CHANGE | | |
| ACTION SCENARIO C | NOISE REDUCTION | NO CHANGE | ON | OFF | | | |
| | AMBIENT | NO CHANGE | OFF | Voice | | | |
| | REPRODUCTION OF MUSIC | NO CHANGE | NO CHANGE | NO CHANGE | | | |
| | VOLUME OF MUSIC | NO CHANGE | NO CHANGE | NO CHANGE | | | |
| ACTION SCENARIO D | NOISE REDUCTION | ON | | OFF | | | |
| | AMBIENT | OFF | | Normal 60% | | | |
| | REPRODUCTION OF MUSIC | NO CHANGE | | NO CHANGE | | | |
| | VOLUME OF MUSIC | RETURN REDUCED VOLUME | | SLIGHTLY REDUCE VOLUME | | | |

INFORMATION PROCESSING DEVICE, INFORMATION PROCESSING METHOD, AND PROGRAM

CROSS REFERENCE TO RELATED APPLICATIONS

This application is a continuation of U.S. patent application Ser. No. 16/333,742, filed Mar. 15, 2019, which claims the benefit of PCT Application No. PCT/JP2017/028896 having an international filing date of 9 Aug. 2017, which designated the United States, which PCT application claimed the benefit of Japanese Patent Application Nos. 2016-187824 filed 27 Sep. 2016 and 2016-238205 08 filed December 2016, the entire disclosures of each of which are incorporated herein by reference.

TECHNICAL FIELD

The present disclosure relates to an information processing device, an information processing method, and a program.

BACKGROUND ART

In recent years, not only devices that output only audio information but also devices with added functions on assumption of utilization scenes have widely been distributed as audio devices that are used by users mounting them on their heads, such as earphones or headphones (hereinafter referred to as "head mounted-type audio devices"). As a specific example, it is possible to exemplify a head mounted-type audio device capable of suppressing environmental sound (so-called noise) from an external environment and enhancing a soundproofing effect by using a so-called noise reduction technology (noise cancelling technology). Patent Literature 1 discloses an example of an audio device that uses such a noise reduction technology.

Also, in recent years, a technology that enables listening to audio from an external environment even in a state in which a user wears a head mounted-type audio device by collecting audio from the external environment by a sound collecting unit, such as a microphone, and outputting the audio via the head mounted-type audio device has also been proposed. Note that in the following description, the function of enabling listening to the audio from the external environment will also be referred to as an "ambient function."

CITATION LIST

Patent Literature

Patent Literature 1: JP 5194434B

SUMMARY OF INVENTION

Technical Problem

Incidentally, functions related to control of audio output, such as a noise reduction function and an ambient function as described above, are selectively used in accordance with a user's state or situation in many cases in order to realize a reproduced sound field space that a user desires. Meanwhile, a case in which the user's state or situation successively changes may also be assumed. In such a situation, it is necessary for the user to perform complicated operations of activating or deactivating the aforementioned noise reduction, the ambient function, and the like in accordance with the state or situation of the moment and temporarily removing the head mounted-type audio device as needed in some cases, for example.

Thus, the present disclosure proposes an information processing device, an information processing method, and a program that enable listening to audio in a more suitable mode without any complicated operation even in a situation in which the user's state or situation successively changes.

Solution to Problem

According to the present disclosure, there is provided an information processing device including: a recognition processing unit that recognizes a user's state in accordance with a detection result of a predetermined state or situation; and an output control unit that controls audio output from a predetermined output unit on the basis of a function map, which is selected in accordance with a predetermined condition, in which a setting related to control of the audio output is associated with each of a plurality of candidates for the user's state, and the recognized user's state.

In addition, according to the present disclosure, there is provided an information processing method including, by a computer: recognizing a user's state in accordance with a detection result of a predetermined state or situation; and controlling audio output from a predetermined output unit on the basis of a function map, which is selected in accordance with a predetermined condition, in which a setting related to control of the audio output is associated with each of a plurality of candidates for the user's state, and the recognized user's state.

In addition, according to the present disclosure, there is provided a program that causes a computer to execute: recognizing a user's state in accordance with a detection result of a predetermined state or situation; and controlling audio output from a predetermined output unit on the basis of a function map, which is selected in accordance with a predetermined condition, in which a setting related to control of the audio output is associated with each of a plurality of candidates for the user's state, and the recognized user's state.

Advantageous Effects of Invention

According to the present disclosure, the information processing device, the information processing method, and the program that enable listening to audio in a more suitable mode without any complicated operation even in a situation in which the user's state or situation successively changes are provided as described above.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 5 is an explanatory diagram illustrating an outline of the information processing system according to the embodiment.

FIG. 9 is an explanatory diagram for describing an example of a functional map according to Modification Example 1-1 of the embodiment.

FIG. 18 is an explanatory diagram for describing an outline of an information processing system according to Modification Example 2-2.

DESCRIPTION OF EMBODIMENTS

Figure 1:
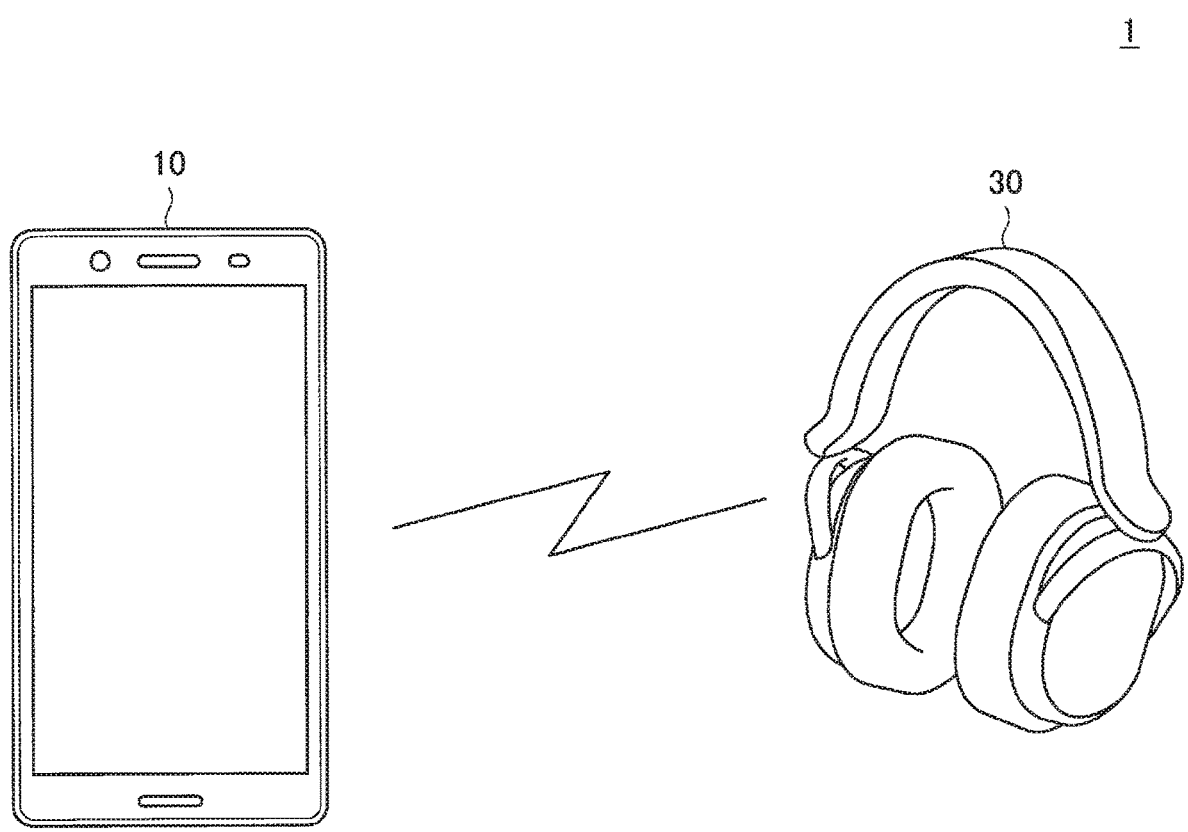
FIG. 1 is an explanatory diagram for describing an example of a schematic configuration of an information processing system according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
1. Introduction
1.1. Configuration example of system
1.2. Configuration example of audio device
1.3. Examination related to control of audio output
2. First Embodiment
2.1. Outline
2.2. Functional configuration
2.3. Processing
2.4. Modification examples
2.5. Evaluation
3. Second Embodiment
3.1. Outline
3.2. Functional configuration
3.3. Action scenario
3.4. Processing
3.5. Modification examples
3.6. Evaluation
4. Hardware configuration
5. Conclusion 1. Introduction <1.1. Configuration Example of System>

First, an example of a schematic configuration of an information processing system according to an embodiment of the present disclosure will be described with reference to FIG. 1. FIG. 1 is an explanatory diagram for describing an example of a schematic configuration of an information processing system according to an embodiment of the present disclosure.

As illustrated in FIG. 1, an information processing system 1 according to an embodiment includes an information processing device 10 and an audio device 30.

The audio device 30 can be formed as a head mounted-type audio device such as an overhead-type head phone, or an earphone, for example. In addition, the audio device 30 may not include various devices for realizing functions related to control of audio output such as a noise reduction function, and an ambient function. Note that an example of the configuration of the audio device 30 to realize the noise reduction function and the ambient function will be additionally described in detail.

The information processing device 10 can be formed as a smartphone, a tablet terminal, a mobile-type audio player, or the like, for example. The information processing device 10 and the audio device 30 can mutually transmit and receive various kinds of information via a wired or wireless network by being connected to the network.

The information processing device 10 controls operations of the audio device 30 via the network on the basis of the configuration described above. In a specific example, the information processing device 10 may control operations of the audio device 30 (in particular, operations related to audio output) by transmitting a control command for causing a desired operation to be executed to the audio device 30 via the network. In a more specific example, the information processing device 10 may switch ON/OFF of the functions related to control of the audio output such as the noise reduction function, and the ambient function by transmitting the command to the audio device 30. Also, the information processing device 10 may control the volume of audio (for example, audio content or the like) output from the audio device 30 by transmitting the control command to the audio device 30 in another example. In addition, the information processing device 10 may acquire information related to the audio device 30 (for example, information related to an operation state or the like) from the audio device 30 via the network. In this case, the information processing device 10 may present the information acquired via the predetermined output unit to the user. Also, the information processing device 10 may control operations of the audio device 30 in accordance with the acquired information in another example.

Note that the function of the information processing device 10 controlling operations of the audio device 30 via the network may be realized by a predetermined application being installed on the information processing device 10, for example. In addition, an application for realizing the function may be installed in advance on the information processing device 10 in another example.

Note that the example described above is just an example and the configuration of the information processing system is not necessarily the example illustrated in FIG. 1. In a specific example, the information processing device 10 and the audio device 30 may be integrally formed. Also, in another example, the information processing device 10 and the audio device 30 may be connected via another device (for example, a server or the like).

The example of the schematic configuration of the information processing system according to the embodiment of the present disclosure has been described above with reference to FIG. 1.

<1.2. Configuration Example of Audio Device>

Figure 2:
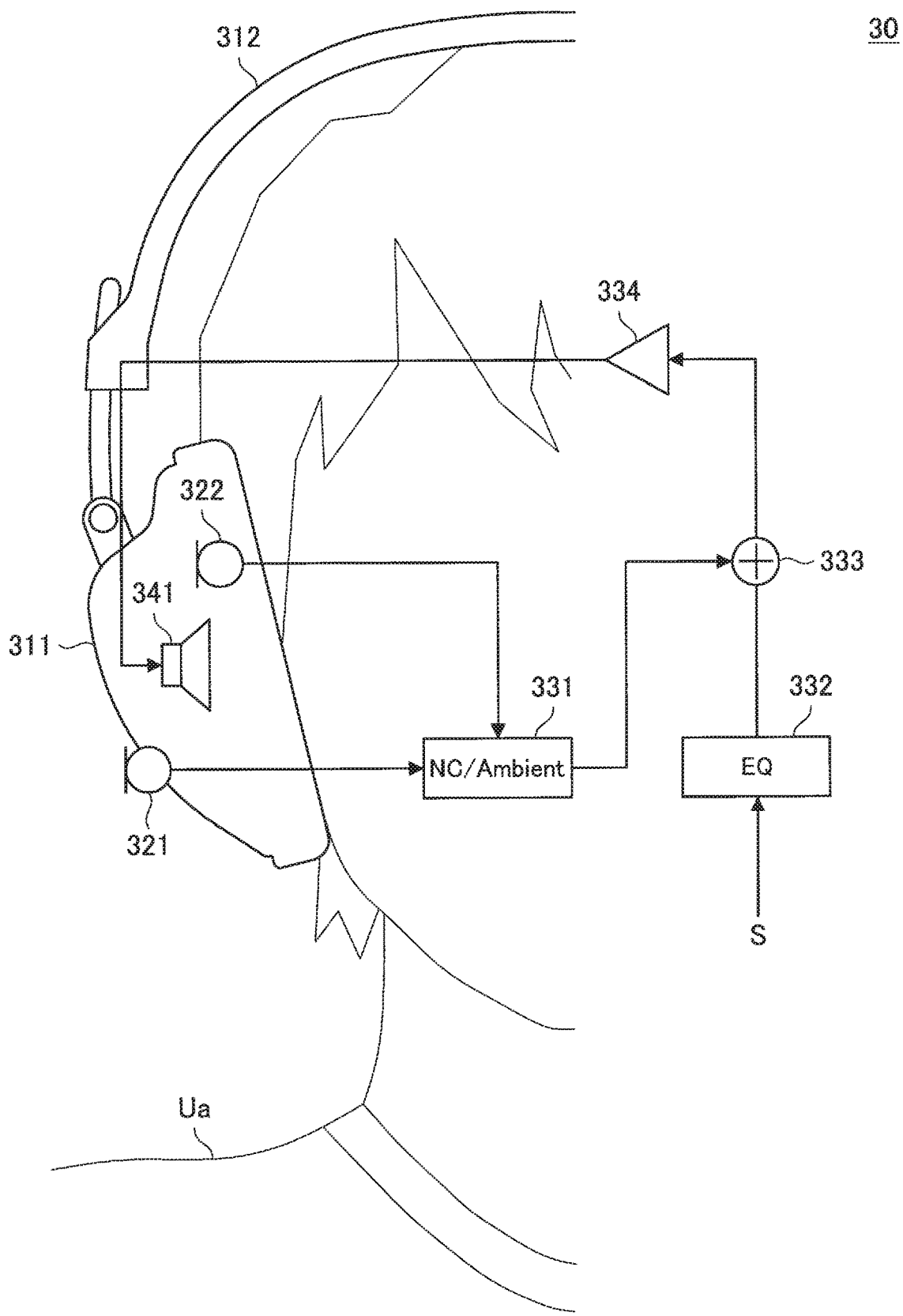
FIG. 2 is an explanatory diagram for describing an example of a configuration of an audio device according to the embodiment.

Next, an example of a configuration of the audio device 30 will be described with reference to FIG. 2. FIG. 2 is an explanatory diagram for describing an example of the configuration of the audio device according to an embodiment of the present disclosure. Note that in the description, an example of the configuration of the audio device 30 will be described with particular focus on a configuration for realizing the noise reduction function and the ambient function.

As illustrated in FIG. 2, the audio device 30 is formed as a so-called headphone. For example, the audio device 30 includes a case body 311, a headband 312, a sound generation element 341, microphones 321 and 322, a signal processing circuit 331, an equalizer (EQ) 332, an adder 333, and a power amplifier 334.

The case body 311 is attached to cover an ear of a user Ua by being supported such that the case body 311 is located in the vicinity of the ear by the headband 312. Also, the case body 311 is coupled to another case body (omitted in the drawing) that is attached to cover the ear on the opposite side of the user Ua by the headband 312.

The microphone 321 is a sound collecting device for directly collecting audio (for example, environmental sound) that propagates in an external space outside the case body 311. The microphone 321 can be formed as a so-called MEMS microphone that is formed on the basis of a micro electro mechanical systems (MEMS) technology, for example. Note that the installation location of the microphone 321 is not particularly limited as long as the microphone 321 can collect audio that propagates in the external space. In a specific example, the microphone 321 may be provided in a case body 311 of the audio device 30 or may be provided at a position different from the case body 311.

The microphone 322 is a sound collecting device for collecting audio that propagates in an internal space inside the case body 311 (that is, a space that is continuous with an ear canal of the user Ua). The microphone 322 can be formed as a so-called MEMS microphone that is formed on the basis of the MEMS technology, for example, similarly to the microphone 321. The microphone 322 is installed such that the microphone 322 faces the direction of the ear canal of the user Ua inside the case body 311, for example. Of course, it is needless to say that the installation location of the microphone 322 is not particularly limited as long as the microphone 322 can collect audio that propagates in the internal space.

The signal processing circuit 331 has a configuration for executing various kinds of signal processing for realizing the noise reduction function and the ambient function as described above.

For example, the signal processing circuit 331 may realize the noise reduction function on the basis of a so-called feed forward scheme using a result of collecting the audio that propagates in the external space outside the case body 311 and is collected by the microphone 321. In this case, the signal processing circuit 331 generates a noise reduction signal on the basis of the result of collecting the audio using the microphone 321 and outputs the generated noise reduction signal to the adder 333 located in a later stage.

In addition, the signal processing circuit 331 may realize the noise reduction function on the basis of a so-called feedback scheme using the result of collecting the audio that propagates in the internal space inside the case body 311 and is collected by the microphone 322. In this case, the signal processing circuit 331 generates a noise reduction signal on the basis of the result of collecting the audio using the microphone 322 and outputs the generated noise reduction signal to the adder 333 located in the later stage.

Note that the signal processing circuit 331 may realize the noise reduction function by combining the feed forward scheme and the feedback scheme. In this case, the signal processing circuit 331 generates the noise reduction signal on the basis of the results of collecting the audio using the respective microphones 321 and 322. Then, it is sufficient if the signal processing circuit 331 generates a synthesized noise reduction signal by synthesizing the respective generated noise reduction signals and outputs the generated synthesized noise reduction signal to the adder 333 located in the later stage.

In addition, the signal processing circuit 331 may realize the ambient function by using the result of collecting the audio (that is, environmental sound) that propagates in the external space outside the case body 311 and is collected by the microphone 321 in another example. In this case, the signal processing circuit 331 outputs an audio signal based on the result of collecting the audio using the microphone 321 to the adder 333 located in the later stage, for example.

The equalizer 332 performs so-called equalizing processing on the audio signal (hereinafter, also referred to as "audio input" in some cases) input to the audio device 30, such as audio content or a signal received by an audio telephone. The audio input on which the equalizing processing has been performed by the equalizer 332 is added to the audio signal output from the signal processing circuit 331 (that is, the noise reduction signal or the result of collecting the environmental sound) using the adder 333, is amplified by the power amplifier 334, and is converted into audio by the sound generation element 341.

The sound generation element 341 corresponds to a so-called speaker and converts the audio signal into audio by being driven on the basis of the input audio signal.

With the configuration described above, the audio signal obtained by adding the audio input and the noise reduction signal is converted into audio by the sound generation element 341, and the user Ua listens to the audio in a case in which the noise reduction function has been activated, for example. Therefore, in this case, the user Ua can listen to the audio input with the influence from the environmental sound alleviated. In addition, the audio signal obtained by adding the audio input and the result of collecting the environmental sound is converted into audio by the sound generation element 341, and the user Ua listens to the audio in a case in which the ambient function has been activated in another example. Therefore, in this case, the user Ua can listen to the environmental sound that propagates in the external environment even in a state in which the user Ua is wearing the audio device 30.

The example of the configuration of the audio device 30 has been described above with reference to FIG. 2.

<1.3. Examination Related to Control of Audio Output>

Next, an example of a utilization mode of the function related to the control of the audio output (for example, the noise reduction function, the ambient function, and the like), in particular, will be described as a utilization mode of the information processing system according to an embodiment of the present disclosure, and technical problems of the information processing system according to the embodiment will then be summarized.

For example, the function related to the control of the audio output such as the noise reduction function and the ambient function as described above are selectively used in accordance with a user's state or situation in order to realize a reproduced sound field space that the user desires in many cases. In a specific example, a case in which the ambient function is activated such that it becomes possible to listen to the audio in the external environment is assumed in a situation in which it is necessary for the user to recognize the surrounding situation as in a case in which the user is moving outdoors. Also, in another example, a case in which the noise reduction function is activated such that it is possible to listen to audio content such as music in a more suitable environment by suppressing the environmental sound from the external environment and enhancing a sound proofing effect is assumed in a situation in which the user is listening to the audio content in a calm state.

Meanwhile, a case in which the user's state or situation successively changes can also be assumed. In a case of assuming a scene in which the user rides a train, for example, a situation in which the noise reduction function is deactivated and the ambient function is activated in order for the user to easily recognize the surrounding situation can be assumed before the user gets on the train. In contrast, a situation in which the noise reduction function is activated and the ambient function is deactivated in order for the user to easily listen to the audio content until the user gets to the destination station can be assumed after the user gets on the train. In such a case, it is necessary for the user to perform complicated operations of activating or deactivating (that is, turns ON or OFF) the functions such as the noise cancelling and the ambient function as described above and temporarily removing the head mounted-type audio device as needed in accordance with the state or situation of the moment in some cases, for example.

In view of such situations, the present disclosure proposes a technology that enables listening to audio in a more suitable mode without any complicated operations (that is, provides a more suitable reproduced sound field space) even in a situation in which a user's state or situation successively changes. Note that the information processing system according to an embodiment of the present disclosure will be described below in more detail.

2. First Embodiment

<2.1. Outline>

First, an information processing system according to a first embodiment of the present disclosure will be described. For example, FIGS. 3 to 5 are explanatory diagrams for describing an outline of the information processing system according to the embodiment.

The information processing system according to the embodiment recognizes a user's state (in particular, a state in relation to a user's action) and controls operations of the audio device 30 (in particular, operations related to audio output) in accordance with the recognition result. For example, FIG. 3 illustrates an example of a schematic configuration for realizing the information processing system according to the embodiment. As illustrated in FIG. 3, the information processing system according to the embodiment includes a recognition engine for recognizing a user's state (action) incorporated in an application for controlling operations of the audio device 30, for example.

Figure 3:
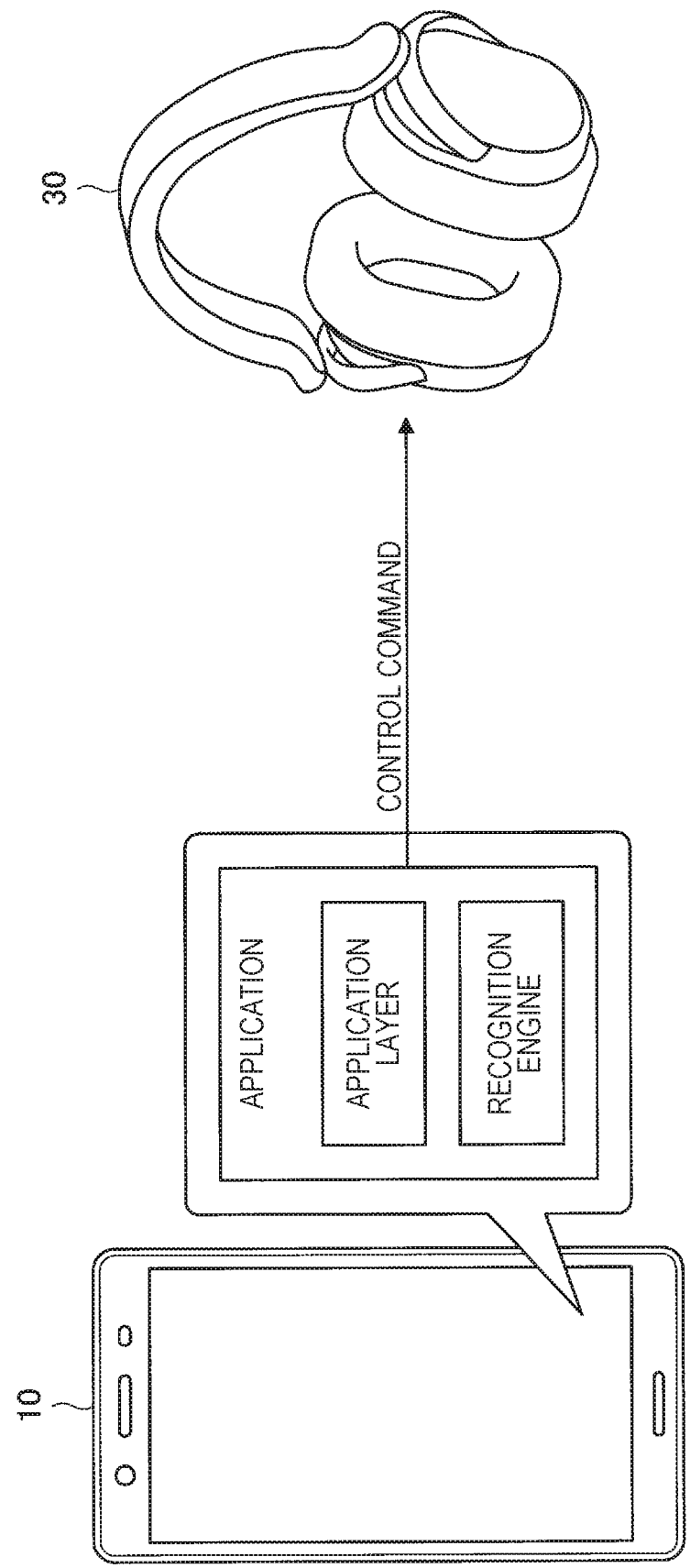
FIG. 3 is an explanatory diagram illustrating an outline of the information processing system according to the embodiment.

The recognition engine illustrated in FIG. 3 recognizes a state (action) of the user who holds the information processing device 10 on the basis of detection results of various sensors provided in the information processing device 10, for example. In a more specific example, the recognition engine recognizes the state of the user who holds the information processing device 10 by analyzing detection results such as a change in the position or the orientation of the information processing device 10 or oscillation of the information processing device 10 obtained by an acceleration sensor (for example, a three-axis acceleration sensor) provided in the information processing device 10.

Figure 4:
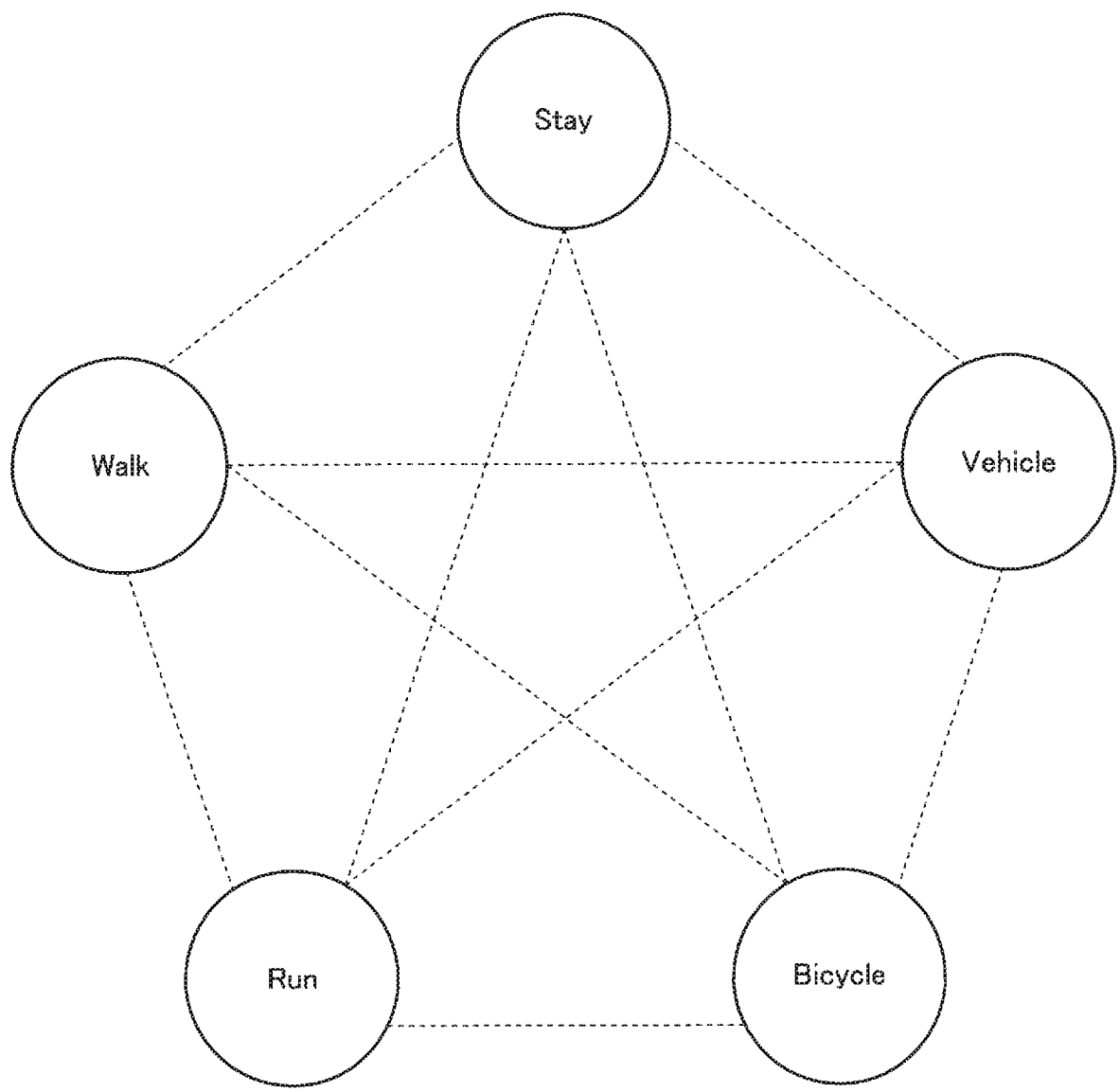
FIG. 4 is an explanatory diagram illustrating an outline of the information processing system according to the embodiment.

For example, FIG. 4 illustrates an example of candidates for the user's state that is recognized by the recognition engine. In FIG. 4, "Stay" represents a state in which the user is still (in other words, the state in which the user is not walking or running). Also, "Walk" represents a state in which the user is walking and "Run" represents a state in which the user is running. In addition, "Vehicle" represents a state in which the user is traveling on transportation such as a bus or a train. Also, "Bicycle" represents a state in which the user is traveling on a bicycle.

In addition, a control process for controlling operations of the audio device 30 operates on an application layer using the recognition engine as a basis. That is, the control process decides settings related to control of audio output using the audio device 30 in accordance with the result of recognizing the user's state using the recognition engine and generates a control command in accordance with the decided settings. Then, the control process controls the operations related to audio output using the audio device 30 by transmitting the generated control command to the audio device 30 via the network.

For example, FIG. 5 illustrates an example of settings for the operations related to audio output in accordance with a user's state. Specifically, in the example illustrated in FIG. 5, settings for ON/OFF of the noise reduction function, ON/OFF of the ambient function, ON/OFF of reproduction of music (for example, audio content), and content of control for volume related to reproduction of music is illustrated for the respective candidates for the user's state described above with reference to FIG. 4. Note that in the following description, control data that defines settings of the operations related to audio output for each of the assumed candidates for the user's state will also be referred to as a "function map" as illustrated in FIG. 5.

Specifically, in the function map illustrated in FIG. 5, various settings are associated with the state represented as "Stay" such that the noise reduction function is activated, the ambient function is deactivated, reproduction of music is activated, and the volume of the music is reduced. Since it is possible to suppress environmental sound (so-called noise) from the external environment and to enhance the sound proofing effect with such settings, the user can listen to the music (audio content) in a state in which the influence of the noise is reduced.

Also, various settings are associated with the state represented as "Vehicle" such that the noise reduction function is activated, the ambient function is deactivated, reproduction of music is activated, and the volume of the music is set to a value that is set in advance as a reference. Therefore, the user can listen to the music (audio content) in a state in which the influence of noise is reduced even in this case.

Also, various settings are associated with the states represented as "Walk" and "Run" such that the noise reduction function is deactivated, the ambient function is activated, reproduction of music is activated, and the volume of the music is set to a value that is set in advance as a reference. With such settings, it is possible for the user to listen to the environmental sound from the external environment and to thereby recognize the surrounding situation in a state in which the user is wearing the audio device 30. In addition, since the volume of the music is adjusted to the value that is set in advance as a reference even if the volume has been set to a relatively higher value, it becomes easier for the user to listen to the environmental sound from the external environment that is taken using the ambient function.

In addition, only a part of the aforementioned settings for a series of operations related to audio output may be a target of control for at least some of the candidates for each user's state. In the function map illustrated in FIG. 5, for example, only the setting related to control of the noise reduction function is associated with the state represented as "Bicycle", and the settings for deactivating the noise reduction function are made.

Note that the function map illustrated in FIG. 5 is just an example and the setting in relation to the control of audio output associated with each of the candidates for the user's state is not necessarily limited to the example illustrated in FIG. 5. That is, in the function map according to the embodiment, a combination of settings related to each of a plurality of types of control may be associated for each of the candidates for the user's state as in the example illustrated in FIG. 5, or the setting may be associated with only one type of control. Also, types of operations related to audio output that become targets of control are also not limited. In a specific example, only the noise reduction function and the ambient function may be set as targets of control. Also, in another example, different operations related to audio output other than those in the example illustrated in FIG. 5 may be set as targets of control. In Addition, the candidates for the user's state described above are just examples, and the states are not necessarily limited to those in the example described above as long as the states can be recognized by the recognition engine. In a specific example, although "Vehicle" that is a candidate of the user's state has been described as a state in which the user is traveling on transportation such as a bus or a train, the transportation is not limited to the bus or the train, and a state in which the user is traveling by taking another mobile body such as a motorbike, a ship, an airplane, or the like, for example, may be recognized. Note that it is possible to cause the recognition engine to recognize the state in which the user is traveling by taking such a mobile body, using a technology such as machine learning, for example.

On the basis of the configuration as described above, the information processing device 10 according to the embodiment recognizes the user's state at a predetermined timing, for example (every several seconds, for example), and controls operations of the audio device 30 in accordance with the result of recognizing the user's state of the moment. In this manner, it becomes possible for the user to listen to audio (for example, music that is being reproduced, environmental sound in the surroundings, or the like) in a more suitable mode without any complicated operations of turning ON or OFF the functions such as noise canceling and ambient function and temporarily removing the audio device 30 even in a situation in which the state or situation of the user himself/herself successively changes.

The outline of the information processing system according to the embodiment has been described with reference to FIGS. 3 to 5. Note that the information processing system according to the embodiment will be described in more detail below.

<2.2. Functional Configuration>

Figure 6:
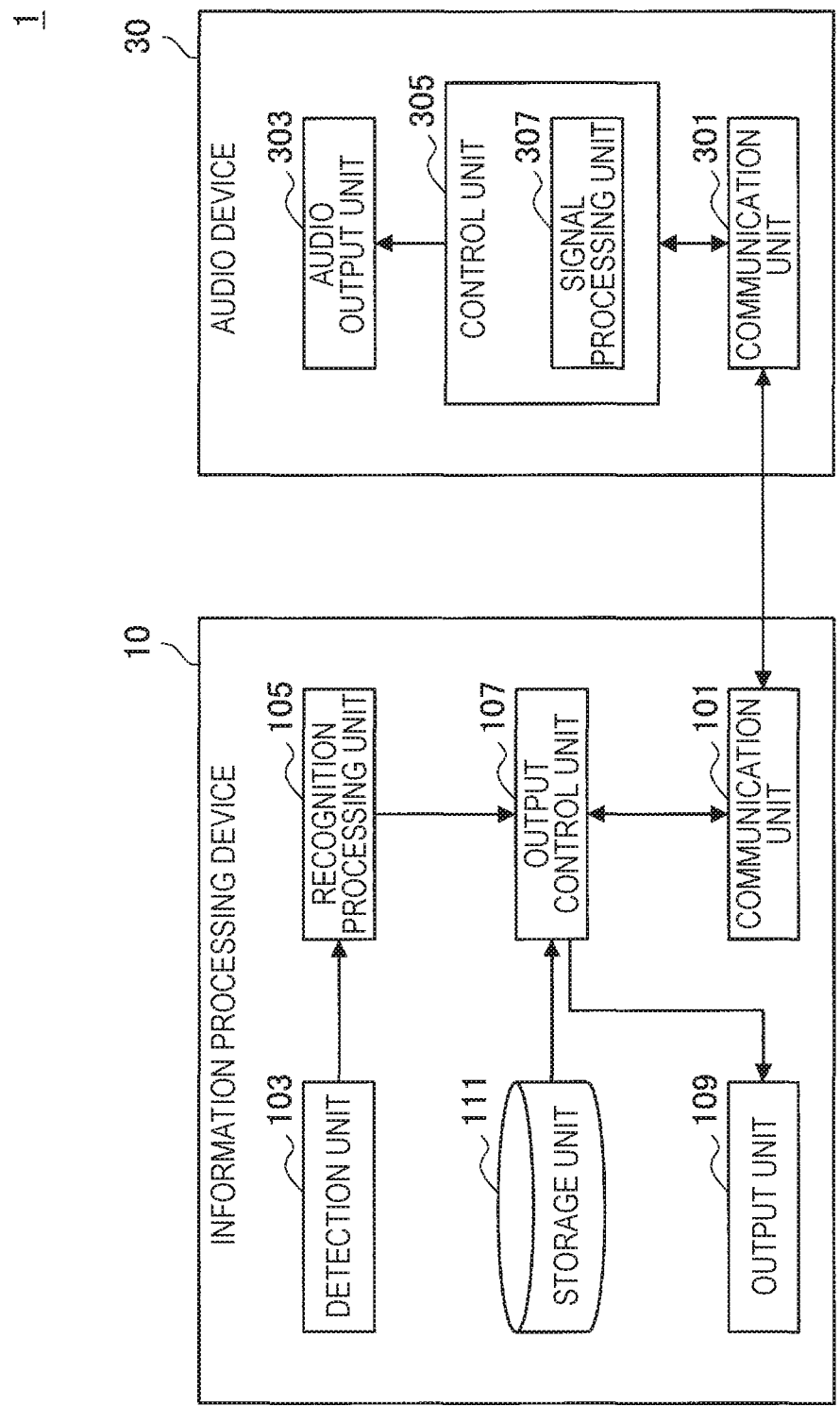
FIG. 6 is a block diagram illustrating an example of a functional configuration of an information processing system according to a first embodiment of the present disclosure.

Next, an example of a functional configuration of the information processing system according to the embodiment will be described with reference to FIG. 6. FIG. 6 is a block diagram illustrating an example of the functional configuration of the information processing system according to the embodiment. Note that the description will be given on the assumption that the information processing system according to the embodiment is configured such that the information processing device 10 and the audio device 30 are connected to each other via the network as illustrated in FIG. 1.

(Audio Device 30)

First, description will be given with particular focus on the configuration of the audio device 30. As illustrated in FIG. 6, the audio device 30 includes a communication unit 301, a control unit 305, and an audio output unit 303.

The communication unit 301 is a configuration for the audio device 30 transmitting and receiving various kinds of information to and from other external devices (for example, the information processing device 10) via a predetermined network. The communication unit 301 may include a communication antenna, a radio frequency (RF) circuit, a baseband processor, and the like in a case of transmitting and receiving various kinds of information to and from external devices via a wireless network, for example. Note that in the following description, it is assumed that the respective configurations of the audio device 30 transmit and receive information via the communication unit 301 in a case of transmitting and receiving information to and from other external devices unless otherwise particularly described.

The audio output unit 303 includes a sound generation element (for example, the sound generation element 341 illustrated in FIG. 2) such as a speaker, converts an input drive signal (audio signal) into audio, and outputs the audio.

The control unit 305 is a configuration for controlling operations of the audio output unit 303. The control unit 305 performs predetermined audio processing on the audio signal (that is, audio input) transmitted from the information processing device 10 via a predetermined network and causes the audio output unit 303 to convert the audio signal into audio and output the audio.

In addition, the control unit 305 may include a signal processing unit 307 that performs various kinds of signal processing on the audio input. For example, the signal processing unit 307 may perform various kinds of signal processing for realizing the noise reduction function on the audio input. In this case, it is sufficient if the signal processing unit 307 generates a noise reduction signal on the basis of a result of collecting the audio in the external environment (that is, the environmental sound) with a predetermined microphone (omitted in the drawing) and adds the generated noise reduction signal to the audio input, for example.

Also, in another example, the signal processing unit 307 may perform various kinds of signal processing for realizing the ambient function on the audio input. In this case, it is sufficient if the signal processing unit 307 adds the result of collecting the audio in the external environment (that is, the environmental sound) with a predetermined microphone (omitted in the drawing) to the audio input, for example.

Note that the processing of the control unit 305 and the signal processing unit 307 described above are just an example, and the types thereof are not limited to the example described above as long as the processing relates to audio output based on the input audio signal. In addition, the various kinds of processing of the control unit 305 and the signal processing unit 307 may be controlled by the information processing device 10 via the network. In this case, it is sufficient if the control unit 305 and the signal processing unit 307 execute the various kinds of processing on the basis of the control command transmitted from the information processing device 10 via the network, for example.

(Information Processing Device 10)

Next, description will be given with particular focus on the configuration of the information processing device 10. As illustrated in FIG. 6, the information processing device 10 includes a communication unit 101, a detection unit 103, a recognition processing unit 105, an output control unit 107, an output unit 109, and a storage unit 111.

The communication unit 101 has a configuration in which the information processing device 10 transmits and receives various kinds of information to and from other external devices (for example, the audio device 30) via a predetermined network. The communication unit 101 may include a communication antenna, an RF circuit, a baseband processor, and the like in a case of transmitting and receiving the various kinds of information to and from external devices via a wireless network, for example. Note that in the following description, it is assumed that the information is transmitted and received via the communication unit 101 in a case in which each configuration of the information processing device 10 transmits and receives the information with other external devices unless otherwise particularly described.

The output unit 109 is an output interface for the information processing device 10 presenting various kinds of information to the user. The output unit 109 may include a display device that outputs images such as a stationary image or a moving image, such as a so-called display, for example. In addition, the output unit 109 may include an audio device that outputs audio, such as a speaker, for example. In addition, the output unit 109 may include an oscillation device that presents information to the user by oscillating in a pattern corresponding to the information as a target of the presentation, such as a so-called vibrator.

The storage unit 111 is a storage region for temporarily or permanently store various kinds of data. For example, data for the information processing device 10 executing various functions may be stored in the storage unit 111. In a specific example, data (for example, a library) for executing various applications, management data for managing various settings and the like may be stored in the storage unit 111. In addition, data for various kinds of content (for example, audio content such as music and the like) may be stored in the storage unit 111.

The detection unit 103 has a configuration for detecting various states and situations. In a specific example, the detection unit 103 includes various sensors such as an acceleration sensor, an angular speed sensor, and the like and detects changes in the position or the orientation of a predetermined object (for example, the information processing device 10). It is possible to detect a motion of the object, for example, from the thus detected information and thus to recognize (estimate) a state (a state related to a user's action such as walking or running, in particular) of the user who holds the object.

In addition, the detection unit 103 may include a configuration to detect the position of the information processing device 10 (thus, the user who holds the information processing device 10) such as a global positioning system (GPS) or the like in another example.

In addition, the detection unit 103 may include a configuration to acquired information to recognize or estimate a state or situation of the external environment of the information processing device 10 (thus, the user who holds the information processing device 10) in another example. For example, the detection unit 103 may include an imaging unit such as a so-called camera and acquire a result of capturing a video (for example, a stationary image or a moving image) of the external environment using the imaging unit. It is possible to recognize or estimate the situation in the surroundings of the user who holds the information processing device 10, for example, by analyzing the thus captured video. In addition, the detection unit 103 may include a sound collecting unit such as a so-called microphone and may acquire a result of collecting audio in the external environment (for example, environmental sound) using the sound collecting unit. It is also possible to recognize or estimate the situation in the surroundings of the user who holds the information processing device 10 by analyzing the thus collected audio.

As described above, the detection unit 103 detects various states or situations at a predetermined timing and successively outputs information indicating the detection result to the recognition processing unit 105, which will be described later.

The recognition processing unit 105 successively acquires the information indicating the detection result of the various states or situations from the detection unit 103 and recognizes (or estimates) the state (the state related to the user's action, in particular) of the user who holds the information processing device 10 on the basis of the acquired information.

Figure 7:
FIG. 7 is an explanatory diagram for describing an outline of processing related to recognition of a user's state.

Specifically, the recognition processing unit 105 includes a configuration corresponding to the recognition engine described above with reference to FIG. 3, uses the information acquired from the detection unit 103 as input, and determines which of the candidates for the user's state described above with reference to FIG. 4 the user's state corresponds to at a predetermined timing. Here, an example of processing of recognizing the user's state using the recognition processing unit 105 will be described with particular focus on the processing of the recognition engine, in particular, with reference to FIG. 7. FIG. 7 is an explanatory diagram for describing an outline of processing related to recognition of the user's state. Note that the description will be given with particular focus on a case in which the recognition engine recognizes the user's state on the basis of the detection result of a change in the position or the orientation of the information processing device 10 that is obtained by the acceleration sensor.

Specifically, the recognition engine aggregates detection results that are successively output from the acceleration sensor at a predetermined period (for example, five seconds) regarded as one frame. Then, the recognition engine classifies the detection results aggregated for each frame into classes (the candidates for the user's state illustrated in FIG. 4, for example) set during so-called machine learning on the basis of teacher data generated in advance by the learning. As described above, the recognition processing unit 105 calculates likelihoods (probabilities at which the states correspond to the classes) for the respective classes (that is, the candidates for the user's state) and outputs the results of calculating the likelihoods as a temporally output value. For example, the recognition engine may perform the calculation such that the total of the likelihoods of the respective classes such as "Stay", "Walk", "Run", "Vehicle", and "Bicycle" becomes 1.0 among the classes. It is a matter of course that this is just an example and values output as the results of calculating the likelihoods of the respective classes are not necessarily limited. In a specific example, the likelihoods of the respective classes may be individually calculated independently from the other classes.

On the basis of such a configuration, the recognition processing unit 105 recognizes the user's state on the basis of information indicating the likelihoods of the respective classes output from the recognition engine. For example, it is assumed that the likelihood of "Walk" is the highest while the likelihood of "Vehicle" is the lowest from among the classes that represent the respective candidates for the user's state illustrated in FIG. 4. In this case, the recognition processing unit 105 recognizes the user's state as "Walk".

As described above, the recognition processing unit 105 recognizes the user's state for each frame and outputs information indicating the recognition result to the output control unit 107, which will be described later.

The output control unit 107 controls operations of the audio device 30 connected to the information processing device 10 via the network. For example, the output control unit 107 may read and reproduce audio content from a predetermined storage region (for example, the storage unit 111), transmit an audio signal based on the reproduction result to the audio device 30, and thus cause the audio device 30 to output audio in accordance with the audio signal.

In addition, the output control unit 107 controls operations of the audio device 30 by transmitting a control command to the audio device 30. For example, the output control unit 107 may generate the control command on the basis of a user input via a predetermined input unit (omitted in the drawing). In this manner, the output control unit 107 can control operations of the audio device 30 in a mode that the user desires.

In addition, the output control unit 107 may acquire information indicating the result of recognizing the user's state from the recognition processing unit 105, transmit a control command in accordance with the acquired information, and thus control operations of the audio device 30 in another example. Specifically, the output control unit 107 specifies a setting related to control of audio output in accordance with the user's state by comparing the acquired information indicating the result of recognizing the user's state with the function map described above with reference to FIG. 5. Note that it is sufficient if the function map that is generated in advance, for example, is caused to be stored in advance in a predetermined storage region (for example, the storage unit 111) that the output control unit 107 can refer to. Then, the output control unit 107 controls operations of the audio device 30 by transmitting the control command in accordance with the specified setting to the audio device 30. With such a configuration, the operations of the audio device 30 related to audio output, such as the noise reduction function, the ambient function, ON/OFF of reproduction of the music, and the volume related to the reproduction of the music, for example, are dynamically controlled in accordance with the user's state of the moment.

Note that the timing at which the output control unit 107 controls the operations of the audio device 30 in accordance with the information indicating the result of recognizing the user's state that is acquired from the recognition processing unit 105 is not particularly limited. In a specific example, in a case in which a change in the user's state has been recognized, the output control unit 107 may control the operations of the audio device 30 by transmitting the control command in accordance with the user's state after the change to the audio device 30. Also, in a case in which a change in the user's state has been recognized, the output control unit 107 may set only a setting that has been updated in accordance with the change in the user's state as a target of control from among the settings in accordance with the user's state after the change. In this case, the output control unit 107 may control the operations of the audio device 30 by transmitting the control command only for the updated setting to the audio device 30. In addition, the output control unit 107 may periodically control the operations of the audio device 30 by transmitting the control command in accordance with the result of recognizing the user's state at a predetermined timing to the audio device 30 every time the timing is reached. It is a matter of course that the examples described above are just example and the timing at which the output control unit 107 controls the operations of the audio device 30 in accordance with the result of recognizing the user's state may appropriately be changed in accordance with a utilization mode of the information processing system 1 according to the embodiment.

In addition, the output control unit 107 may cause the output unit 109 to output various kinds of information and thus present the information to the user. In a specific example, the output control unit 107 may feed back the control result to the user by causing the output unit 109 to output information in accordance with the result of controlling the operations of the audio device 30. In addition, the output control unit 107 may acquire various kinds of information (for example, information indicating an operation state or the like) related to the audio device 30 from the audio device 30 and cause the output unit 109 to output the acquired information. In this manner, the user can recognize the state of the audio device 30 connected to the information processing device 10 via the network.

Note that the aforementioned functional configuration of the information processing system 1 is just an example, and the functional configuration of the information processing system 1 is not necessarily limited to the example illustrated in FIG. 6 as long as it is possible to realize the respective functions of the information processing device 10 and the audio device 30. In a specific example, the information processing device 10 and the audio device 30 may be integrally formed. In addition, a part of the respective configurations in the information processing device 10 may be provided in another device (for example, a server or the like) that is different from the information processing device 10 in another example.

As described above, an example of the functional configuration of the information processing system according to the embodiment has been described above with reference to FIG. 6.

<2.3. Processing>

Figure 8:
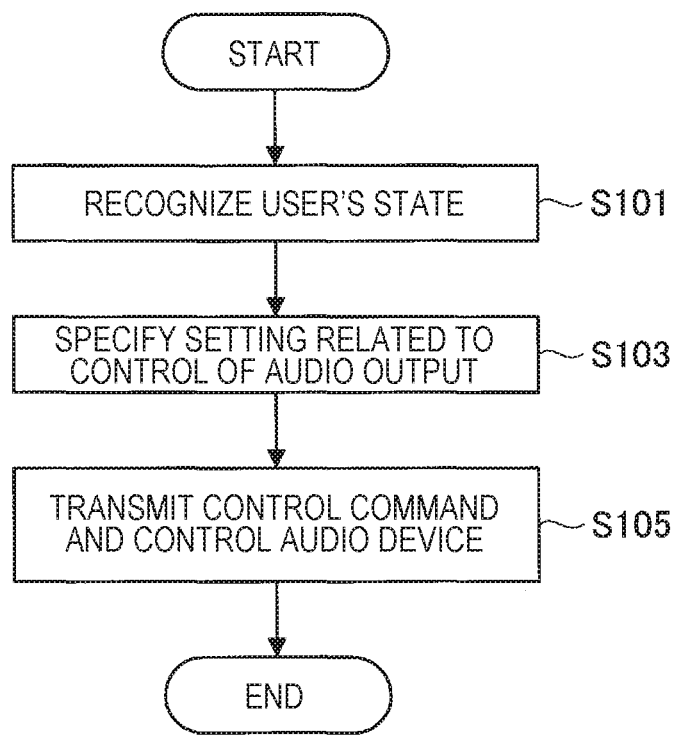
FIG. 8 is a flowchart illustrating an example of a flow of a series of processing of the information processing system according to the embodiment.

Next, an example of a flow of a series of processing of the information processing system according to the embodiment will be described by paying an attention to processing of recognizing the user's state using the information processing device 10 and controlling the operations of the audio device 30 in accordance with the recognition result, in particular, with reference to FIG. 8. FIG. 8 is a flowchart illustrating an example of a flow of a series of processing of the information processing system according to the embodiment.

As illustrated in FIG. 8, the information processing device 10 (the recognition processing unit 105) recognizes a state (a state related to a user's action) of a user who holds the information processing device 10 on the basis of information indicating detection results of various states or situations that are successively acquired by the detection unit 103 (S101).

Then, the information processing device 10 (output control unit 107) specifies settings (for example, settings such as the noise reduction function and the ambient function) related to control of audio output in accordance with the user's state by comparing the result of recognizing the user's state with a predetermined function map (S103).

Then, the information processing device 10 (output control unit 107) controls operations of the audio device 30 by transmitting a control command in accordance with the specified setting to the audio device 30 via the network (S105). Note that in a case in which a change in the user's state has been recognized, the information processing device 10 may control operations of the audio device 30 in accordance with the user's state after the change at this time.

The operations of the audio device 30 related to audio output such as the noise reduction function, the ambient function, ON/OFF of reproduction of music, and the volume related to the reproduction of the music, for example, are dynamically controlled in accordance with the user's state of the moment through the processing as described above.

Note that the timing at which the series of processing illustrated in FIG. 8 is executed is not particularly limited. In a specific example, the information processing device 10 may periodically execute the series of processing illustrated in FIG. 8 at a predetermined timing. In addition, the information processing device 10 may be triggered by a predetermined event and execute the series of processing illustrated in FIG. 8 in another example. It is a matter of course that the aforementioned examples are just examples and the timing at which series of processing illustrated in FIG. 8 is executed may appropriately be changed in accordance with a utilization mode of the information processing system 1.

The example of the flow of the series of processing of the information processing system according to the embodiment has been described above with reference to FIG. 8 with particular focus on the processing of recognizing the user's state using the information processing device 10 and controlling the operations of the audio device 30 in accordance with the recognition result, in particular.

<2.4. Modification Examples>

Next, modification examples of the information processing system according to the embodiment will be described.

Modification Example 1-1: Example of Function Map

First, another example of the function map will be described as Modification Example 1-1. In the function map described above with reference to FIG. 5, settings of the control related to audio output are associated with the respective candidates for the user's state in a one-to-one fashion. Therefore, in a case in which the user's state has been recognized as "Stay", for example, the operations of the audio device 30 are uniquely controlled such that the noise reduction function is activated, the ambient function is deactivated, reproduction of music is activated, and the volume of the music is reduced.

Meanwhile, even if the user's state has transitioned to "Stay", a setting that the user desires as a setting of control related to audio output may differ in accordance with a situation of the moment. In a case in which the user's state has transitioned from "Walk" to "Stay", for example, a case in which a user who is walking outdoors stopped walking and is temporarily stopping can be assumed. In such a case, there may be a case in which it is more desirable that the noise reduction is deactivated and the ambient function is activated similarly to the setting for the case in which the user's state is "Walk" in order for the user to recognize the situation in the surroundings even if the user's state has transitioned to "Stay", for example.

Meanwhile, in a case in which the user's state has transitioned from "Vehicle" to "Stay", there may be a case in which the user is also brought into a stopping state when a train stops in a situation in which the user is traveling by riding the train. In this case, there may be a case in which it is not desirable that the setting of control related to audio output is successively changed in accordance with the stopping and the starting of the train and it is desirable that the settings similar to those in the case in which the user's state is "Vehicle" is applied even after the user's state transitions to "Stay", for example.

In view of such situations, the function map may be set to take over the previous state (setting) for a part of the candidates for the user's state, for example. For example, FIG. 9 is an explanatory diagram for describing an example of the function map according to Modification Example 1-1 of the embodiment. In the function map illustrated in FIG. 9, settings are made such that ON/OFF of the noise reduction function, ON/OFF of the ambient function, ON/OFF of reproduction of music, and control content of the volume related to reproduction of the music in the previous state are taken over in a case in which the user's state is "Stay" and in a case in which the user's state is "Bicycle". With Such a configuration, a more suitable settings can be applied as a setting of control related to audio output for both the case in which the user's state has transitioned from "Walk" or "Run" to "Stay" and the case in which the user's state has transitioned from "Vehicle" to "Stay" among the cases in which the user's state has transitioned to "Stay", for example.

Note that the example described above is just an example and the present disclosure is not necessarily limited to the example illustrated in FIG. 9. In a specific example, a setting may be made such that a previous state is taken over only for a part of the series of settings (for example, only the noise reduction function and the ambient function) of the control related to audio output.

In addition, settings of control related to audio output may be associated with the respective combinations of states before and after transition in another example. In a specific example, settings of control related to audio output may be individually associated for the case in which the user's state has transitioned from "Walk" to "Stay" and the case in which the user's state has transitioned from "Vehicle" to "Stay".

Another example of the function map has been described above as Modification Example 1-1 with reference to FIG. 9.

Modification Example 1-2: Update of Function Map

Next, an example of a case in which the function map is updated will be described as Modification Example 1-2. In the aforementioned embodiment, the case in which the function map to be applied is fixedly set has been described. Meanwhile, a case in which settings of control related to audio output that users desire may differ depending on the users can be assumed in the respective user's state. In view of such a situation, a function of updating the function map that the information processing device 10 applies may be provided in the information processing device 10.

In a specific example, the information processing device 10 according to Modification Example 102 may present a user interface for updating a function map that the information processing device 10 itself holds to the user. More specifically, the information processing device 10 may present setting content of the function map that the information processing device 10 itself holds, that is, settings related to control of audio output associated with the respective candidates for the user's state to the user via a predetermined output unit. In addition, the information processing device 10 may update at least a part of the settings related to control of audio output associated with the respective candidates for the user's state on the basis of a user input provided via a predetermined input unit. With such a configuration, it is possible to customize the settings related to control of audio output in accordance with the result of recognizing the user's state for each user.

The example of the case in which the function map is updated has been described above as Modification Example 1-2.

Modification Example 1-3: Example of Control Related to Recognition of User's State Next, an example of a case in which teacher data is updated through machine learning will be described as an example of control related to recognition of a user's state using the information processing device 10 will be described as Modification Example 1-3. As described above, the information processing device 10 aggregates detection results obtained by the detection unit such as various sensors for each frame, classifies the aggregation results into classes set during machine learning on the basis of teacher data generated in advance through the learning, and thus recognizes the user's state.

Incidentally, in a case in which the teacher data is generated in advance, it is difficult to generate the teacher data on the assumption of individual users, and the teacher data is generated on the basis of more general trend. Meanwhile, a case in which correspondences between user's actions and states detected by the detection unit in accordance with the actions differ for the respective users depending on information unique to the individual users (motions unique to the users such as habits, for example) can also be assumed.

In view of such a situation, the information processing device 10 according to Modification Example 1-3 is configured to be able to update the teacher data that is used to recognize the user's state through machine learning using the result of recognizing the user's state on the basis of the detection result obtained by the detection unit. In a specific example, the information processing device 10 may generate a sample by associating detection results in the past obtained by the detection unit and the results of recognizing the user's state in accordance with the detection result and update the teacher data used to recognize the user's state on the basis of the sample. With such a configuration, the information processing device 10 can dynamically update the teacher data on the basis of the result of recognizing the user's state and thus more accurately recognize the user's state even in a situation in which there are influences of a motion unique to each user, such as a habit, for example.

The example of the case in which the teacher data is updated through the machine learning has been described above as an example of the control related to recognition of the user's state using the information processing device 10 in Modification Example 1-3.

<2.5. Evaluation>

As described above, the information processing device 10 recognizes the user's state in accordance with the detection result of the predetermined state or situation and controls operations (in particular, the setting related to control of audio output) of the audio device 30 in accordance with the result of recognizing the user's state in the information processing system according to the embodiment. With such a configuration, the user can listen to various kinds of audio such as so-called audio content, environmental sound in the surroundings, or the like in a more suitable mode without any complicated operations even in a situation in which the user's state or situation successively changes.

3. Second Embodiment

<3.1. Outline>

Next, an information processing system according to a second embodiment of the present disclosure will be described. In the aforementioned first embodiment, an example of technologies for controlling operations (in particular, the setting related to control of audio output) of the audio device 30 in accordance with the user's state has been described. Meanwhile, there may be a case in which more suitable settings related to control of audio output in the respective user's states are differ for a use case on the assumption of utilization when the user commutes to work on weekdays and for a use case on the assumption of utilization when the user is doing exercise on holidays, for example. In view of such a situation, an example of the technologies of controlling operations of the audio device 30 in a more suitable mode in accordance with a situation of the moment by appropriately switching the function map in accordance with a scenario on the assumption of a user's action (hereinafter, also referred to as an "action scenario") in the embodiment.

<3.2. Functional Configuration>

Figure 10:
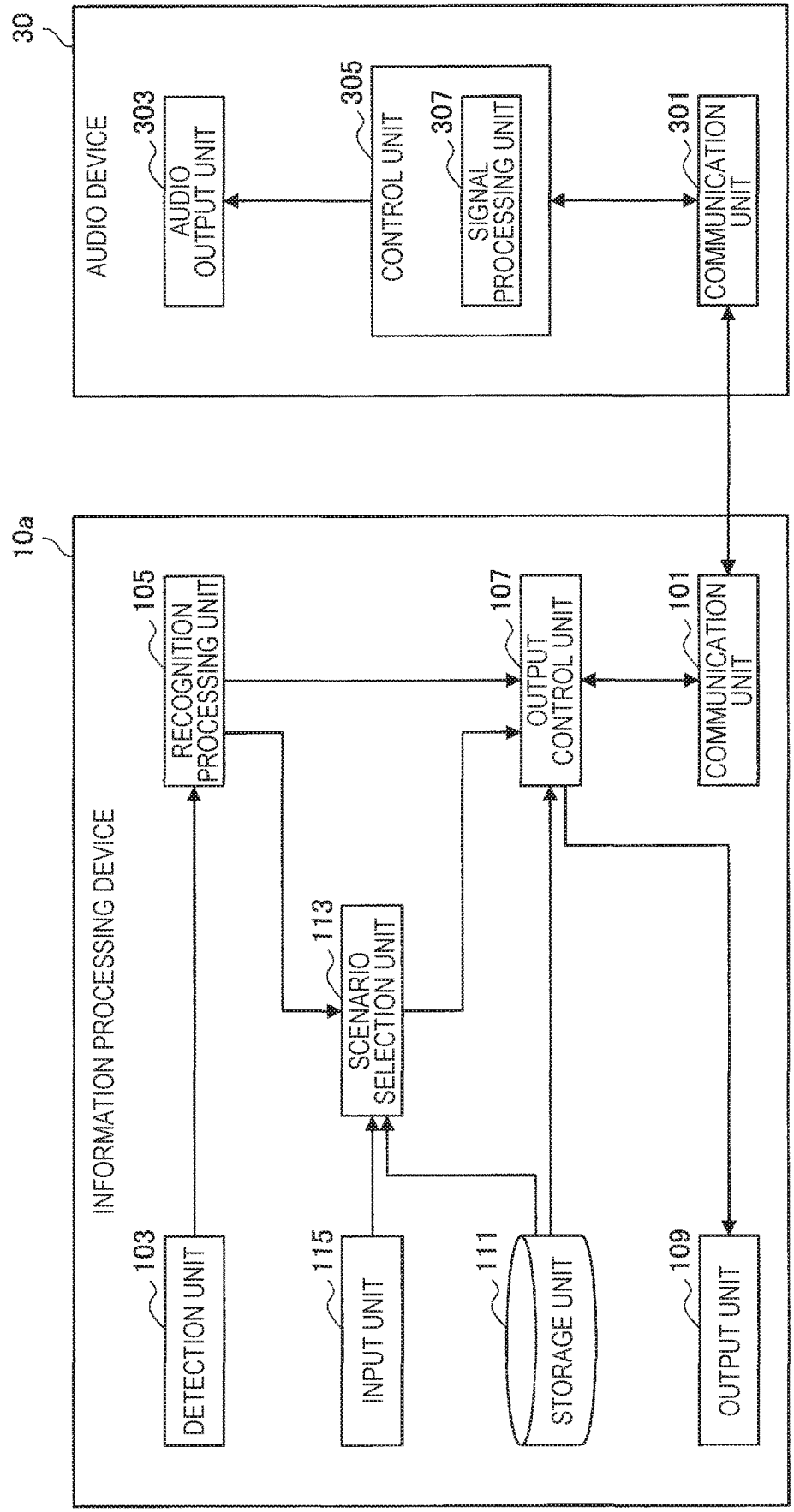
FIG. 10 is a block diagram illustrating an example of a functional configuration of an information processing system according to a second embodiment of the present disclosure.

First, an embodiment of a functional configuration of an information processing system according to the embodiment will be described with reference to FIG. 10. FIG. 10 is a block diagram illustrating an example of the functional configuration of the information processing system according to the embodiment. Note that in the description, the information processing system according to the embodiment will also be referred to as an "information processing system 1a" in a case in which the information processing system is distinguished form the information processing system 1 according to the aforementioned first embodiment.

As illustrated in FIG. 10, the information processing system 1a according to the embodiment includes an information processing device 10a and an audio device 30. Note that the audio device 30 is similar to the audio device 30 in the information processing system 1 according to the aforementioned first embodiment (see FIG. 6). Therefore, details description of the configuration of the audio device 30 will be omitted.

In addition, the information processing device 10a is a configuration corresponding to the information processing device 10 in the information processing system 1 according to the aforementioned first embodiment and is different from the aforementioned information processing device 10 in that the information processing device 10a includes a scenario selection unit 113, in particular. Thus, the configuration of the information processing device 10a will be described with particular focus on parts that are different from those of the information processing device 10 according to the aforementioned first embodiment, in particular, and detailed description of the configurations that are similar to those in the information processing device 10 will be omitted in the embodiment.

The input unit 115 is an input interface for the user inputting various kinds of information to the information processing device 10a. The input unit 115 may include input devices such as a button, a lever, a touch panel, and the like, for example.

The recognition processing unit 105 successively acquires information indicating detection results of various states and situations from the detection unit 103, recognizes (or estimates) the state of the user (in particular, the state related to a user's action) who holds the information processing device 10 on the basis of the acquired information, and outputs the recognition result to the output control unit 107. The operation is similar to that of the information processing device 10 according to the aforementioned first embodiment.

In addition, the recognition processing unit 105 may acquire information indicating the various states or situations as information related to selection information for the scenario selection unit 113, which will be described later, selecting an action scenario. Examples of the information related to the selection condition for the action scenario (which will be described later in detail) include information indicating a date, a day, and a time zone, for example, user's position information, and the like. For example, the recognition processing unit 105 may acquire information indicating a date and a day of that day by referring to information such as a calendar or the like. In addition, the recognition processing unit 105 may recognize a time zone at that point on the basis of a time counting result obtained by a time counting unit in another example. In addition, the recognition processing unit 105 may acquire information indicating the position of the user who holds the information processing device 10 on the basis of position information acquired by the detection unit 103 (for example, a GPS or the like) in another example.

In addition, the recognition processing unit 105 may acquire information related to attribute of the user, such as an age, a sex, and the like of the user, as the information related to the selection condition for the action scenario. For example, the recognition processing unit 105 may acquire the information related to the attribute of the user, such as an age, a sex, and the like of the user, by referring to user information registered in advance in the information processing device 10. In addition, the recognition processing unit 105 may acquire the information related to the attribute of the user by accessing a network service such as an SNS or the like in another example.

The recognition processing unit 105 acquire the information indicating various states and situations and information related to the attribute of the user as information related to the selection condition for the action scenario and outputs the acquired information to the scenario selection unit 113.

The scenario selection unit 113 acquires the information related to the selection condition for the action scenario from the recognition processing unit 105, estimates the user's action (in other words, transition of the user's state) on the basis of the acquired information, and selects an action scenario corresponding to the estimation result.

In a specific example, the scenario selection unit 113 may recognize that it is in a commuting time on a weekday in accordance with information indicating a date and a day and information indicating a time zone and select an action scenario corresponding to the user's action during the commute to time on a weekday. In addition, the scenario selection unit 113 may recognize that the user is located near his/her home in accordance with the position information of the user and select an action scenario on the assumption of a case in which the user moves to a station that is closest to his/her home during the commuting time on a weekday at this time. Also, the scenario selection unit 113 may select an action scenario corresponding to a user's action on a holiday in accordance with the information indicating a date and a day in another example. In addition, the scenario selection unit may select an action scenario or the like corresponding to an action in a case in which the user does exercise such as a sport on a holiday in accordance with the information indicating a time zone and the position information of the user at this time. Also, the scenario selection unit 113 may select an action scenario by referring to information or the like related to a user's schedule registered in advance and estimating a user's action on the basis of the reference result in another example. For example, the scenario selection unit 113 may specify transportation that the user uses to move to a location that is a destination of the user registered as the schedule on the basis of the information regarding the location and specify an action scenario in accordance with the specified transportation. Note that further details of the action scenario will additionally be described later by exemplifying a specific example.

In addition, the scenario selection unit 113 may select an action scenario on the basis of a user input provided via the input unit 115 in another example. Note that in this case, the information processing device 10 may present a user interface (for example, a GUI) for selecting the action scenario to the user via the output unit 109. With such a configuration, the user can selectively switch the action scenario to be applied by selecting a desired action scenario on the basis of the operation performed on the presented user interface, for example.

Then, the scenario selection unit 113 extracts a function map corresponding to the selected action scenario. Note that it is sufficient if the function map is generated in advance for each action scenario that can be assumed and is stored in advance in a storage region (for example, the storage unit 111) that the scenario selection unit 113 can refer to, for example. In addition, it is sufficient if the function map corresponding to each action scenario is generated such that a more suitable setting related to control of audio output is associated with each of the candidates for the user's state in accordance with the use case assumed in the action scenario. Then, the scenario selection unit 113 outputs the extracted function map to the output control unit 107.

The output control unit 107 acquires the function map extracted in accordance with the result of selecting the action scenario from the scenario selection unit 113. In addition, the output control unit 107 acquires information indicating the result of recognizing the user's state from the recognition processing unit 105. The output control unit 107 specifies a setting related to control of audio output in accordance with the selected action scenario and the recognized user's state by comparing the function map acquired from the scenario selection unit 113 with the information indicating the result of recognizing the user's state that is acquired for the recognition processing unit 105. Then, the output control unit 107 controls operations of the audio device 30 by transmitting a control command in accordance with the specified setting to the audio device 30.

The information processing device 10 can control the operations of the audio device 30 in a more suitable mode in accordance with the situation of the moment by appropriately switching (dynamically switching, for example) the function map in accordance with the action scenario (in other words, a use case) on the assumption of the user's action through the aforementioned control.

The example of the functional configuration of the information processing system according to the embodiment has been described above with reference to FIG. 10.

<3.3. Action Scenario>

Next, an example of an action scenario related to switching of the function map and an example of control related to selection of the action scenario will be described in more detail.

(Action Scenario 1 on Assumption of Action During Commute to Work: In Case there is Enough Time)

Figure 11:
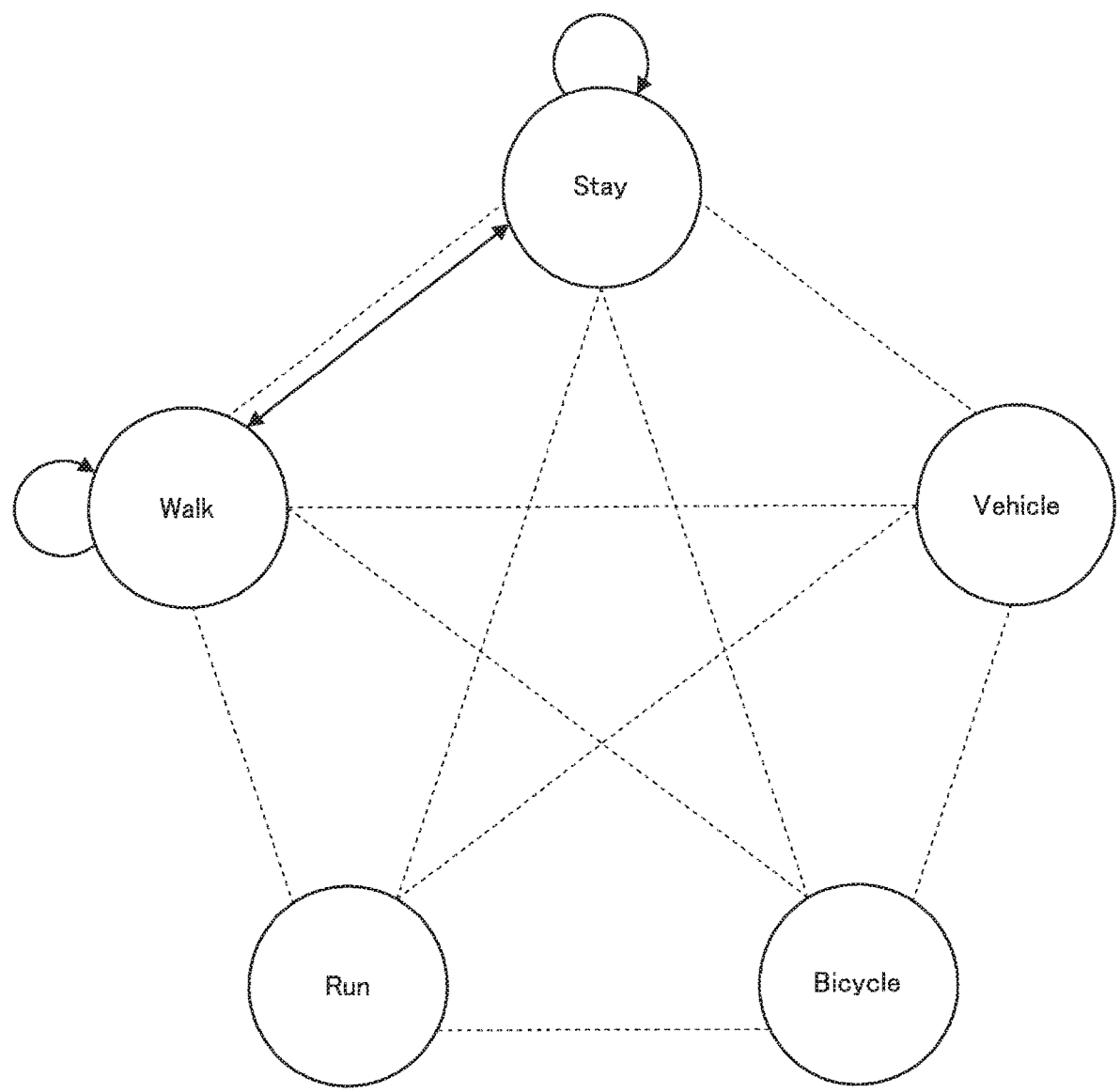
FIG. 11 is an explanatory diagram for describing an example of an action scenario on the assumption of a user's action during commute to work.
Figure 12:
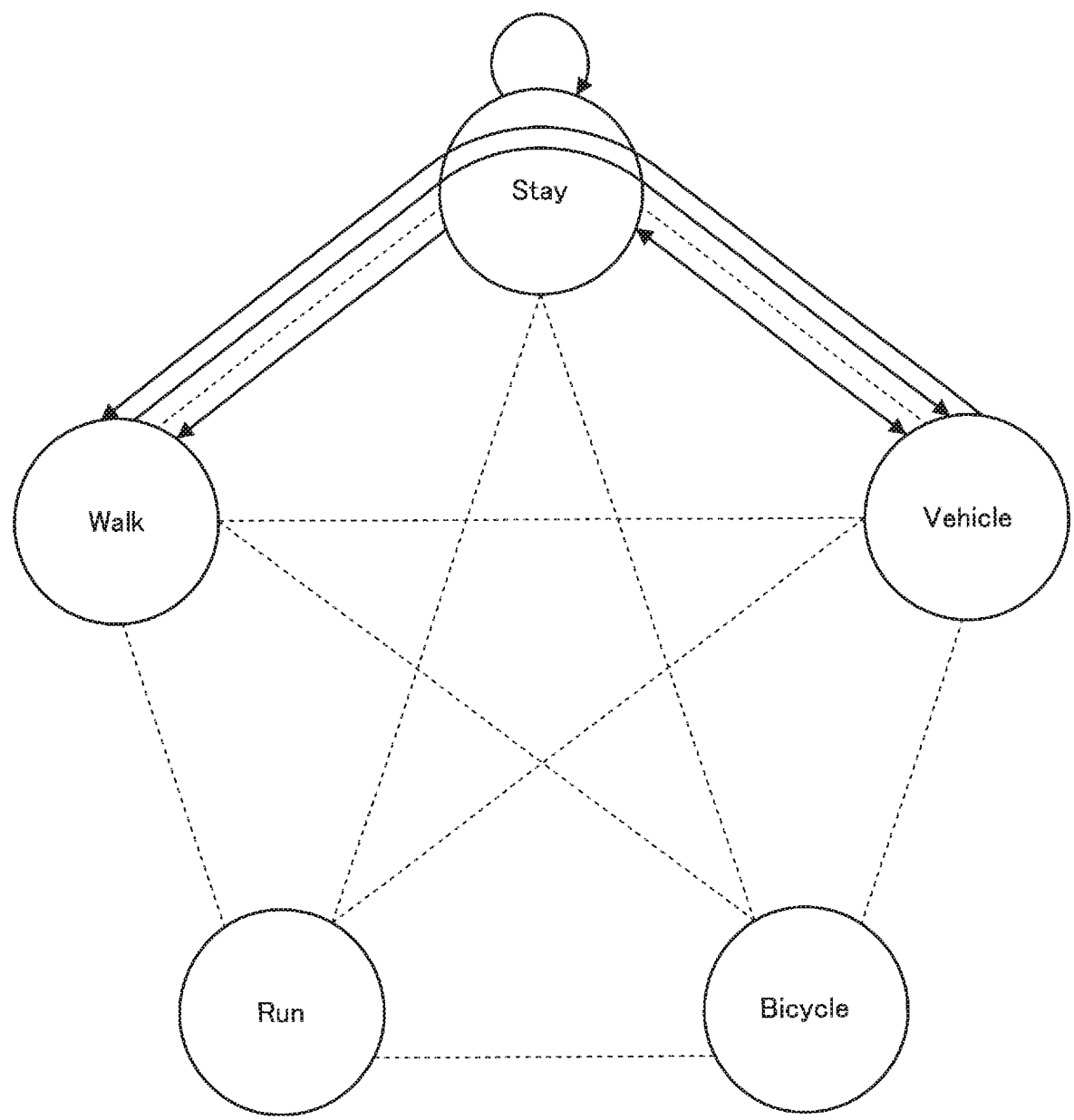
FIG. 12 is an explanatory diagram for describing an example of an action scenario on the assumption of a user's action during commute to work.

First, examples of transition of a user's action and a user's state recognized by the information processing device 10 at that time will be described with particular focus on a case in which there is a relatively enough time such as a case in which the user commutes to work as scheduled as one example of an action scenario on the assumption of the user's action during the commute to work. For example, FIGS. 11 and 12 are explanatory diagrams for describing an example of the action scenario on the assumption of the user's action during the commute to work.

First, referring to FIG. 11, an example of transition of the user's state (action) on the assumption of a situation in which the user leaves home and walks to a nearest station during commute to work on a week day will be described by exemplifying a specific example.

For example, it is assumed that the user brings the information processing device 10 (for example, a smartphone) with him/her, wears the audio device 30 (for example, a headphone), leaves his/her home, and starts to walk to the nearest station. In this case, the user's state is recognized as "Stay" first and then transitions to "Walk" when the user starts to walk. Then, the user temporarily stops in front of a crosswalk since due to read light on the way to the station, confirms that the signal changes to blue light, and starts to walk again to the station. In this case, the user's state transitions to "Stay" when the user stops in front of the crosswalk and then transitions again to "Walk" when the signal changes to the blue light and the user starts to walk again.

Then, it is assumed that the user who has arrived at the station passes through a gate and then moves to a platform using an escalator. In this case, the user's state is recognized as "Walk" during the moving to the escalator and then transitions to "Stay" after the user enters the escalator since the user himself/herself stops. In addition, it is assumed that the user gets off the escalator after moving to the platform, moves to a location that the user usually uses to wait for a train, and waits for arrival of the train at the location. In this case, the user's state transitions from "Stay" to "Walk" when the user gets off the escalator and starts to walk and transitions from "Walk" to "Stay" when the user arrives at the location where the user waits for the train. Thereafter, the user is continuously in the user's state of "Stay" until the train arrives.

In this manner, it is possible to understand that the user's state (action) transitions between "Stay" and "Walk" in the series of user's actions of leaving home at the time of commuting to work, walking and moving to the nearest station, moving to the platform after arriving at the station, and waiting for the train that the user schedules to take in the example described above with reference to FIG. 11.

Here, it is assumed that the user is moving outdoors or inside the station in the example described above with reference to FIG. 11. Therefore, there may be a case in which it is desirable that the ambient function is activated such that the user can recognize the situation in the surroundings similarly to the case in which the user is walking even if the walking user temporarily stops to wait for the signal or the like, for example. In view of such a situation, it is sufficient if a function map that is defined such that a previous state (for example, the setting for "Walk") is taken over as a setting related to control of audio output is selected in a case in which the scenario described above with reference to FIG. 11 is assumed, and for example, in a case in which "Stay" is recognized as the user's state. Also, in a case in which "Stay" is recognized as the user's state, a function map defined such that the noise reduction function is deactivated (turned OFF) and the ambient function is activated (turned ON) may be selected in another example.

Next, an example of transition of a user's state (action) on the assumption of a case in which the user who has arrived at a platform of a station uses a train to move to a station near his/her company during commute to work on a weekday will be described by exemplifying a specific example with reference to FIG. 12.

For example, it is assumed that the user who has waited for a train enters the arriving train, moves to a location around the center of a train car and grabs a strap, and then the train departs. In this case, the user's state transitions to "Walk" when the user moves, transitions to "Stay" when the user stops in the train, and then transitions to "Vehicle" when the train departs. Also, it is assumed that the train that the user takes stops at several stations before arriving at the station near the company of the user. In this case, the user's state transitions from "Vehicle" to "Stay" when the train stops and transitions from "Stay" to "Vehicle" when the train departs again. It is assumed that when the train arrives at the station near the company of the user after then, the user takes off the train. In this case, the user's state transitions from "Vehicle" to "Stay" when the train stops and transitions from "Stay" to "Walk" when the user walks and gets off the train.

In this manner, it is possible to understand that the user's state (action) has transitioned from "Walk" to "Stay" and from "Stay" to "Vehicle" with the user's motion of getting on and off the train and the train's motion of repeatedly starting to leave and stopping in the example described above with reference to FIG. 12.

Here, although the user's state transitions between "Stay" and "Vehicle" with the train's action of starting to leave and stopping in the example described above with reference to FIG. 12, it is assumed that the user himself/herself is in a stopping state and is different from the case in which a walking user is intentionally stopping. In view of such a situation, it is sufficient if a function map defined such that a previous state (for example, the setting for "Vehicle") is taken over as a setting related to control of audio output is selected in a case in which the scenario described above with reference to FIG. 12 is assumed, and for example, in a case in which "Stay" is recognized as the user's state.

Note that it is assumed that the user who has gotten off the train passes through the gate, starts to walk and move from the station to the company, goes shopping at a convenience store on the way to the company, and arrives at the company. In this case, the user's state transitions to "Walk" when the user moves, temporarily transitions to "Stay" when the user arrives at the convenience store, and then transitions to "Walk" when the user starts to move again similarly to the example illustrated in FIG. 11, for example. Therefore, it is sufficient if the function map that is similar to that in the example described above with reference to FIG. 11, for example, is selected even in this case.

The example of the change in the user's states (actions) and the transition of the states recognized by the information processing device at that time has been described above with particular focus on the case in which there is a relatively enough time such as a case in which the user commutes to work as scheduled as one example of a scenario on the assumption of user's actions during the commute to work with reference to FIGS. 11 and 12.

(Action Scenario 2 on Assumption of Actions During Commute to Work: In Case in which there is not Enough Time)

Figure 13:
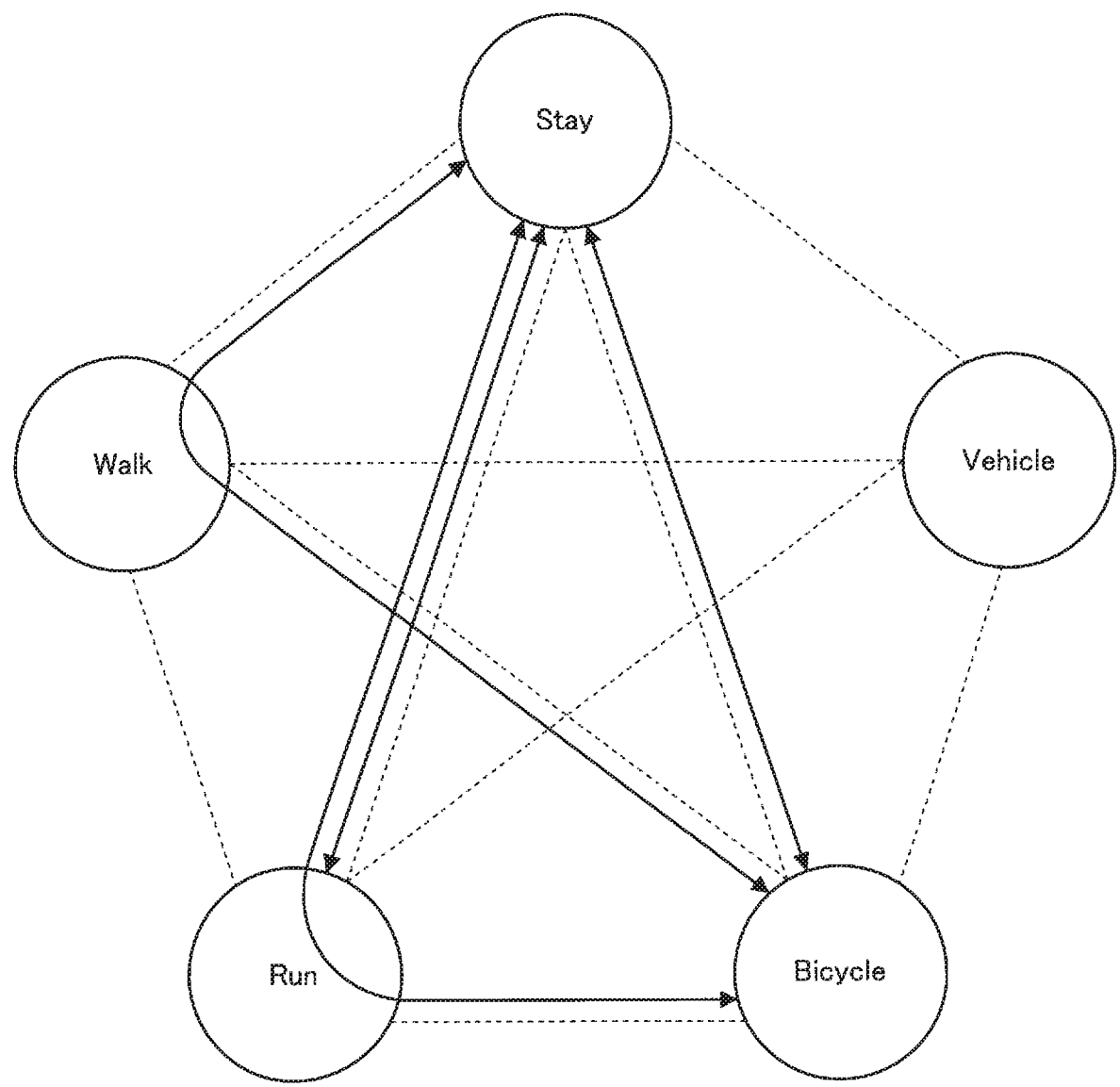
FIG. 13 is an explanatory diagram for describing another example of an action scenario on the assumption a user's action during commute to work.
Figure 14:
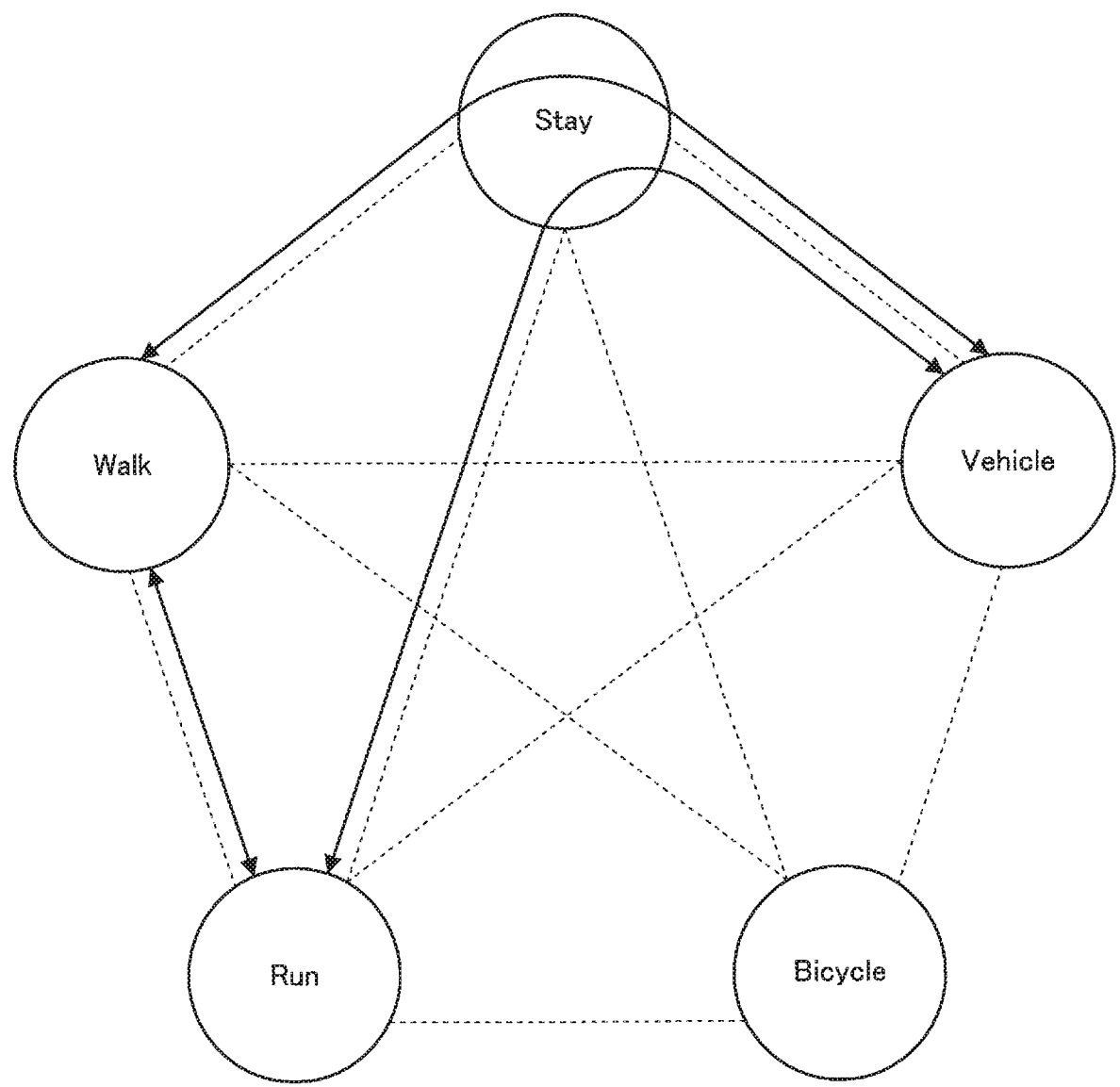
FIG. 14 is an explanatory diagram for describing another example of an action scenario on the assumption a user's action during commute to work.

Next, an example of transition of user's states and user's states recognized by the information processing device 10 at that time will be described with particular focus on a case in which there is not enough time such as in a situation in which the user is likely to be late as another example of the action scenario on the assumption of user's actions during the commute to work. For example, FIGS. 13 and 14 are explanatory diagrams for describing another example of the action scenario on the assumption of the user's actions during the commute to work.

First, an example of transition of the user's states (actions) on the assumption of a situation in which the user leaves his/her home and goes to the nearest station in a hurry by using a bicycle during the commute to work on a week day will be described by exemplifying a specific example with reference to FIG. 13.

For example, it is assumed that the user puts the information processing device 10 in his/her bag, wears the audio device 30, runs to a bicycle parking at his/her home, rides on the bicycle that has been stopped there, leaves home, and then starts to move to the nearest station. In this case, the user's state is recognized as "Stay" first, transitions to "Run" when the user starts to run, and then transitions to "Stay" when the user arrives at the location where the parking bicycle is stopped. Thereafter, when the user rides on the bicycle and starts to move, the user's state transitions from "Stay" to "Bicycle" through "Run" or "Walk".

Then, it is assumed that the user temporarily stops in front of a crosswalk due to read light on the way to the station, checks that the signal changes again to blue, and then moves to the station again. In this case, the user's state transitions from "Bicycle" to "Stay" when the user stops in front of the crosswalk and then transitions to "Bicycle" again when the signal turns to blue and the user starts to move by bicycle again.

Here, it is assumed that the user is in a state of moving outdoors by bicycle in the example described above with reference to FIG. 13. Therefore, there may be a case in which it is desirable that the noise reduction function is deactivated and the ambient function is activated, for example, such that the user can recognize the situation in the surroundings similarly to the time when the user is traveling by bicycle even if the user who is moving by bicycle temporarily stops to wait for the signal or the like, for example. In view of such a situation, in a case in which the scenario described above with reference to FIG. 13 is assumed, and for example, in a case in which "Stay" is recognized as a user's state, it is sufficient if a function map defined such that the previous state (for example, the setting for "Bicycle") is taken over as a setting related to control of audio output is selected. In addition, in the case in which "Stay" is recognized as the user's state, the function map defined such that the noise reduction is deactivated (turned OFF) and the ambient function is activated (turned ON) may be selected in another example.

Next, an example of transition of user's states (actions) on the assumption of a case in which the user who has arrived at a station gets on a train that has already arrived at a platform, moves to a station near his/her company using the train, and then runs and moves to the company during commute to work on a week day will be described by exemplifying a specific example with reference to FIG. 14.

For example, it is assumed that the user who has arrived at the station stops the bicycle at the bicycle parking in front of the station, starts to run to the gate, passes through the gate, goes up to stairs, and runs into a car of the train that has arrived at the platform. In this case, the user's state transitions to "Run" when the user starts to run, transitions to "Stay" when the user who has run into the car of the train stops, and transitions to "Vehicle" when the train departs.

Then, the user moves between train cars by temporarily getting off the train several times at stations on the way and moves to a location near a door that is closer to the gate at the station near the company in order to shorten the time taken to move to the gate after getting off the train. In this case, the user's state transitions from "Vehicle" to "Stay" when the train stops and transitions to "Walk" or "Run" when the user moves. Also, the user's state transitions to "Stay" again when the movement of the user completes and transitions to "Vehicle" again when the train departs.

It is assumed that when the train then arrives at the station near the company, then the user starts to run to the gate, walk and pass through the gate due to crowd in front of the gate, and then starts to run to the company. In this case, the user's state transitions from "Vehicle" to "Stay" when the train stops and transitions to "Run" when the user starts to run to the gate. Also, the user's state transitions to "Walk" when the user walks and passes through the gate and transitions to "Run" when the user passes through the gate and starts to run again.

Here, since the user moves between the train cars at the stations on the way even after getting on the train in the example described above with reference to FIG. 14, there is a case in which it is desirable for the user to be able to recognize the situation in the surroundings while the user's state transitions among "Vehicle", "Stay", and "Walk" or "Run" regardless of the transition. In view of such a situation, in a case in which the scenario described above with reference to FIG. 14 is assumed, and for example, in a case in which "Vehicle", "Stay", "Walk" and "Run" are respectively recognized as the user's states, for example, the function map may be selected such that the noise reduction function is deactivated and the ambient function is activated.

The example of the transition of the user's actions and the user's states recognized by the information processing device at that time has been described with particular focus on the case in which there is not enough time such as in a situation in which the user is likely to be late as another example of the action scenario on the assumption of the user's actions during the commute to work with reference to FIGS. 13 and 14.

(Action Scenario on Assumption of Actions on Holiday)

Figure 15:
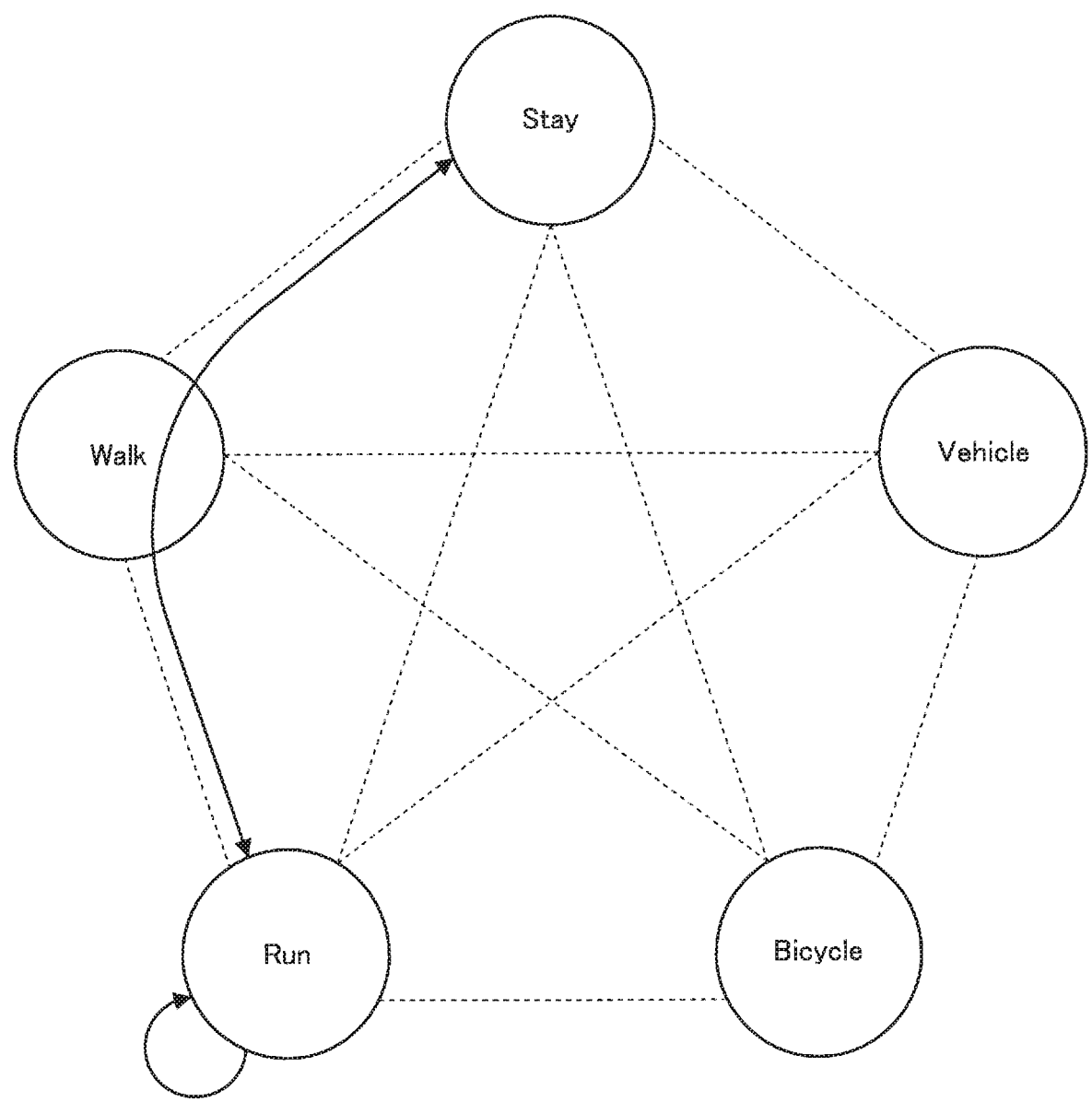
FIG. 15 is an explanatory diagram for describing an example of an action scenario on the assumption of a user's action on a holiday.
Figure 16:
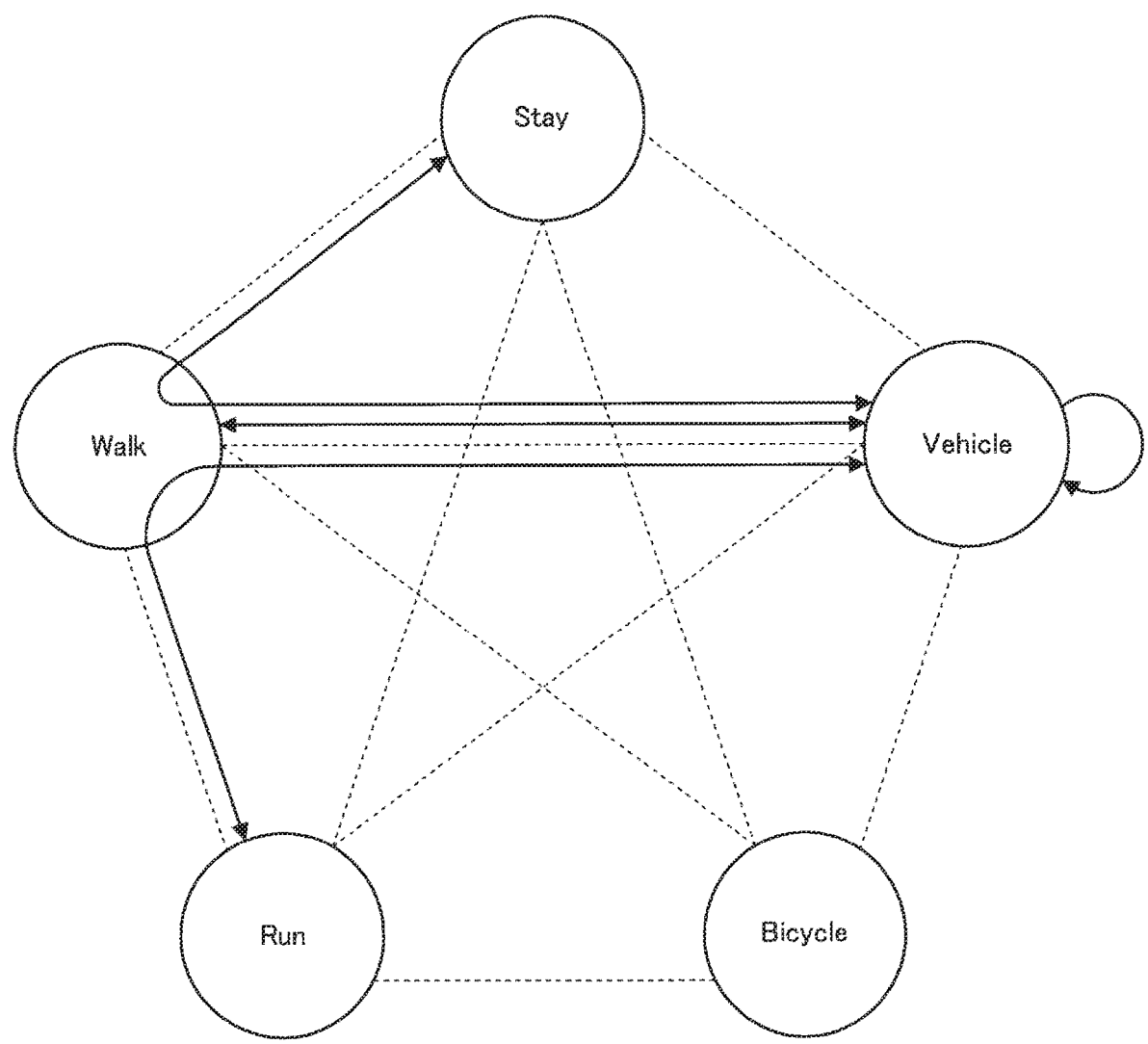
FIG. 16 is an explanatory diagram for describing an example of an action scenario on the assumption of a user's action on a holiday.

Next, an example of an action scenario on the assumption of user's actions on a holiday will be described by exemplifying a specific example with reference to FIGS. 15 and 16. FIGS. 15 and 16 are explanatory diagrams for describing an example of the action scenario on the assumption of the user's actions on a holiday.

First, an example of transition of user's actions and user's state recognized by the information processing device 10 at that time will be described with particular focus on a case in which the user does exercise such as jogging on a holiday with reference to FIG. 15.

For example, it is assumed that the user performs stretching in a state in which the user fixes the information processing device 10 to his/her arm with an armband or the like first, warms up by walking, and then starts to jog. In this case, the user's state is recognized as "Stay" during the stretching, transitions to "Walk" when the user starts to walk, and then transitions to "Run" when the user starts to jog It is assumed that the user then reduces the jogging speed in front of a signal, steps on the spot while waiting for the signal, checks that the signal turns to blue, and gradually increases the jogging speed. In this case, the user's state is recognized as being continuously in the state of "Run".

It is assumed that thereafter, the user runs over some distance, cools down by walking, finally performs stretching, and then ends the series of exercise. In this case, the user's state transitions from "Run" to "Walk" when the user stops jogging and starts to cool down through walking and then transitions from "Walk" to "Stay" when the user stops walking and starts stretching.

Here, in the example described above with reference to FIG. 15, there may also be a case in which the user moves outdoors during the walking and the jogging, for example. In such a case, a function map set such that the noise reduction function is deactivated and the ambient function is activated may be selected such that the user can recognize the situation in the surroundings, for example. Meanwhile, there may be a case in which the user does exercise at a location where entrance of vehicles is restricted, such as an athletic ground. In such a case, a function map set such that the noise reduction function is activated and the ambient function is deactivated may be selected, for example, in order for the user to be able to do exercise while enjoying audio content or the like.

Next, an example of transition of user's actions and user's state recognized by the information processing device at that time will be described with particular focus on a case in which the user moves by riding a train or bus on a holiday with reference to FIG. 16.

First, an example of a case in which the user moves by riding a train on a holiday will be described by exemplifying a specific example. For example, it is assumed that the user runs into a car of a train that has already arrived at a platform in a state in which the user brings the information processing device 10 with him/her and the train departs when the user is moving to find a vacant seat. In this case, the user's state transitions to "Run", first, transitions to "Walk" when the user moves in the car before the train departs, and then transitions to "Vehicle" when the train departs. It is assumed that the user then walks and moves between train cars in order to find a vacant seat when the train stops at a station on the way since there is no vacant seat. In this case, the user's state transitions from "VEHICLE' to "Walk" when the train stops and transitions again to "Vehicle" when the train departs.

It is assumed that the user then moves between the vehicle cars when the train stops at the station on the way, finds a vacant seat, sit on the seat, and stand up again immediately after sitting on it to offer the seat to an elderly who has gotten on the train car, and the train departs again after the user slightly moves. In this case, the user's state transitions from "Vehicle" to "Walk" when the train stops and transitions to "Stay" when the user sits on the seat. In addition, the user's state transitions from "Stay" to "Walk" when the user starts to move after offering the seat to the elderly and then transitions again to "Vehicle" when the train departs.

Also, it is assumed that the train temporarily reduces the speed due to crowd at the platform of the arrival station. In this case, the user's state is recognized as being continuously in the state of "Vehicle".

It is assumed that thereafter, the train arrives at the destination station and the user moves to a location near a door at the same time with the train stopping at the station since the user is likely to be late for an appointment time and starts to run as soon as the door opens. In this case, the user's state transitions from "Vehicle" to "Walk" when the train stops and transitions to "Run" when the door opens and the user starts to run.

Next, an example of a case in which the user moves by taking a bus on a holiday will be described by exemplifying a specific example. For example, it is assumed that the user runs into a bus that has arrived at a bus stop in a state in which the user brings the information processing device 10 with him/her and the bus departs when the user moves in the car. In this case, the user's state transitions to "Run" first, transitions to "Walk" during movement of the user in the car before the bus departs, and then transitions to "Vehicle" when the bus departs.

It is assumed that since the inside of the bus becomes crowded, the user then moves to a location with a space by choosing a timing at which the bus travels at a low speed. In this case, the user's state transitions from "Vehicle" to "Walk" when the bus transitions to low-speed traveling and transitions again to "Vehicle" when the bus increases the speed after the user moves.

In addition, it is assumed that the user moves to a location where a money changer is placed by choosing a timing at which the bus is stopping to wait for a signal in order to change money. In this case, the user's state transitions from "Vehicle" to "Walk" when the bus stops and transitions to "Stay" when the user stops in front of the money changer. Also, it is assumed that the user starts to move to the original position after changing the money, and the bus departs when the user is moving. In this case, the user's state transitions from "Stay" to "Walk" when the user starts to move and then transitions again to "Vehicle" when the bus departs.

In addition, it is assumed that the bus temporarily reduces the speed due to a traffic jam when the bus moves to the destination. In this case, the user's state is recognized as being continuously in the state of "Vehicle".

The example of the transition of the user's action and the user's states recognized by the information processing device at that time has been described above with a particular focus on the case in which the user moves by riding a train or a bus on a holiday with reference to FIG. 16. Here, although the user's state transitions among "Stay", "Walk", and "Vehicle" when the train or the bus departs and stops in the example described above with reference to FIG. 16, a case in which the user is inside the train or the bus is assumed even in the states of "Stay" and "Walk" in such a case. In view of such a situation, in a case in which the scenario described above with reference to FIG. 16, and for example, in a case in which "Stay" or "Walk" is recognized as the user's state, it is sufficient if a function map defined such that the previous state (for example, a setting for "Vehicle") is taken over as a setting related to control of audio output is selected.

The example of the scenario on the assumption of the user's actions on a holiday has been described above by exemplifying a specific example with reference to FIGS. 15 and 16.

(Application of Machine Learning to Selection of Action Scenario)

Next, an example of a case in which a technology of so-called machine learning is applied to processing related to selection of an action scenario will be described.

As described above, the information processing device 10 according to the embodiment may dynamically select the action scenario in accordance with information related to the acquired selection condition of the action scenario (for example, the detection results of various states or situations, the user's attribute information, and the like), and in this case, it is desirable that the action scenario that is more suitable to the situation of the moment be selected. In view of such a situation, the information processing device 10 may apply the technology of machine learning to the processing related to selection of the action scenario.

Specifically, the information processing device 10 classifies the information related to the acquired selection condition of the action scenario into classes set in association with each action scenario during machine learning by comparing the information with teacher data generated in advance through the learning. As described above, it is sufficient if the information processing device 10 calculates a likelihood for each class (that is, the action scenario) and selects the action scenario (thus the function map corresponding to the action scenario) on the basis of the result of calculating the likelihood.

In addition, the information processing device 10 may update the teacher data through machine learning. In this case, it is only necessary for the information processing device 10 to generate a sample by associating the selection condition of the action scenario determined in the past with the result of selecting the action scenario (thus the function map corresponding to the action scenario) in accordance with the condition and update the teacher data to be used to select the action scenario on the basis of the sample.

With the configuration as described above, the information processing device 10 according to the embodiment can more accurately select the action scenario that is more suitable for the situation of the moment. In addition, the information processing device 10 can select the action scenario that is more suitable for the situation of the moment in accordance with the user's action even in a situation in which the action pattern differs depending on each user, for example, by dynamically updating the teacher data trough machine learning.

The example of the case in which the technology of so-called machine learning is applied to the processing related to the selection of the action scenario has been described above.

Note that the action scenarios described above with reference to FIGS. 11 to 16 is just an example and the action scenarios are not necessarily limited only to the aforementioned examples. Also, a unit per which the action scenario is applied is not particularly limited. In a specific example, one action scenario per day may be applied or a day may be divided into a plurality of time zone and different action scenarios may be applied to the respective time zones. Also, an action scenario to be applied may be dynamically switched in accordance with the situation of the moment. In a specific example, different action scenarios may be applied in accordance with a user's current position or a user's destination of movement.

<3.4. Processing>

Figure 17:
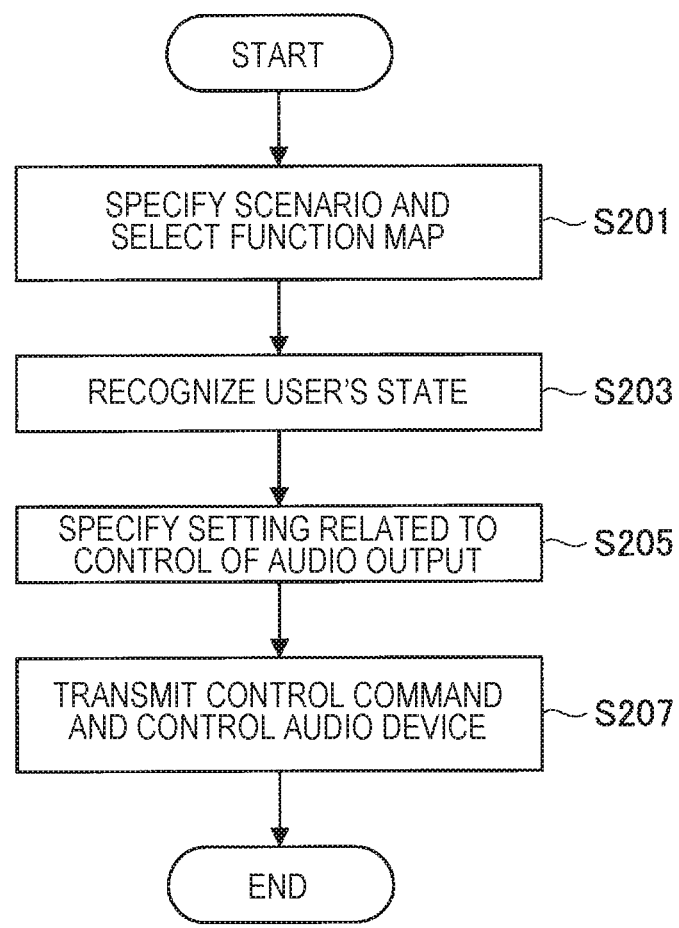
FIG. 17 is a flowchart illustrating an example of a flow of a series of processing of an information processing device 10 according to the embodiment.

Next, an example of a flow of a series of processing of the information processing system according to the embodiment will be described with particular focus on the processing of recognizing a user's state and controlling operations of the audio device 30 in accordance with the recognition result using the information processing device 10, in particular, with reference to FIG. 17. FIG. 17 is a flowchart illustrating an example of the flow of the series of processing of the information processing device 10 according to the embodiment.

As illustrated in FIG. 17, the information processing device 10 (recognition processing unit 105) acquires information indicating various states or situations and information related to user's attribute as information related to a selection condition of an action scenario. Then, the information processing device 10 (scenario selection unit 113) estimates a user's action (in other words, transition of the user's state) on the basis of the acquired information related to the selection condition of the action scenario and selects an action scenario corresponding to the estimation result (S201).

Also, the information processing device 10 (recognition processing unit 105) recognizes a state (in particular, a state related to a user's action) of the user who holds the information processing device 10 on the basis of information indicating detection results of various states or situations that are successively acquired by the detection unit 103 (S203).

Then, the information processing device 10 (output control unit 107) specifies a setting (for example, a setting such as a noise reduction function, an ambient function, or the like) related to control of audio output in accordance with the user's state by comparing a function map selected in accordance with the action scenario with the result of recognizing the user's state.

Then, the information processing device 10 (output control unit 107) controls operations of the audio device 30 by transmitting a control command in accordance with the specified setting to the audio device 30 via the network (S207). Note that in a case in which a change in the user's state is recognized, the information processing device 10 may control the operations of the audio device 30 in accordance with the user's state after the change.

The operations of the audio device 30 related to audio output such as the noise reduction function, the ambient function, ON/OFF of reproduction of the music, and the volume related to the reproduction of the music, for example, are dynamically controlled in accordance with the user's state of the moment through the control as described above.

Note that the timing at which the series of processing illustrated in FIG. 17 is executed is not particularly limited. In a specific example, the information processing device 10 may periodically execute the series of processing illustrated in FIG. 17 at a predetermined timing. In addition, the information processing device 10 may be triggered by a predetermined event and execute the series of processing illustrated in FIG. 17 in another example. It is a matter of course that the aforementioned example is just an example and the timing at which the series of processing illustrated in FIG. 17 is executed may appropriately be changed in accordance with a utilization mode of the information processing system 1a.

The example of the flow of the series of processing of the information processing system according to the embodiment has been described above with particular focus on the processing of recognizing the user's state and controlling the operations of the audio device 30 in accordance with the recognition result using the information processing device 10, in particular, with reference to FIG. 17.

<3.5. Modification Examples>

Next, modification examples of the information processing system according to the embodiment will be described.

Modification Example 2-1: Setting for "Long Stay"

First, an example of a case in which "Long Stay" is provided as a candidate of a user's state will be described as Modification Example 2-1.

As described above, "Stay" represents a state in which the user is still from among the examples of the candidates for the user's state described above with reference to FIG. 4. Meanwhile, as the state in which the user is still, a state in which the user is temporarily stopping to wait for a signal or the like and a state in which the user is still for a long time to take a break or to do some task (for example, a desk work or the like) (in other words, a state in which the user is constantly stopping), for example, are assumed. In view of such a situation, there may be a case in which it is desirable to perform control differently for the case in which the user is temporarily stopping and the case in which the user is constantly stopping depending on a utilization scene, for example.

Thus, in the information processing system according to Modification Example 2-1, the information processing device 10 recognizes the state in which the user is temporarily stopping as "Stay" and recognizes the state in which the user is constantly stopping as "Long Stay" that is different from "Stay". Specifically, the information processing device 10 causes the user's state to transition to "Long Stay" in a case in which the state of "Stay" continues for a predetermined period or longer. With such a configuration, the information processing system according to Modification Example 2-1 can apply mutually different control for the case in which the user's state is "Stay" and the case in which the user's state is "Long Stay".

In a more specific example, the information processing device 10 may not control operations of the audio device 30 in a case in which the state indicating "Stay" has been recognized and may control operations of the audio device 30 in a case in which the state indicating "Long Stay" has been recognized. It is possible to suppress occurrence of an operation in which an operation of the audio device 30 is temporarily changed in a case in which the user temporarily stops for waiting for a signal or the like, for example, through such control.

The example of the case in which "Long Stay" is provided as a candidate of the user's state has been described above as Modification Example 2-1.

Modification Example 2-2: Exclusion from Target of Determination

Next, an example of a case in which a part of candidates for the user's state set in advance is excluded from targets of determination related to control of audio output in accordance with a predetermined condition will be described as Modification Example 2-2.

There may be a case in which it is desirable that a part of the series of candidates related to a user's state described above are not regarded as targets of determination related to control of audio output in accordance with a condition under which the system is used. In a specific example, a case in which an action of using the audio device 30 such as an earphone, a headphone, or the like while riding a bicycle is restricted by law regulation or the like, a case in which it is not desirable to use the audio device 30 in consideration of safety while riding the bicycle, or the like can be assumed.

In addition, there may be a case in which it is not desirable that a part of the series of candidates related to the user's state is not a target of determination related to control of audio output in a part of a plurality of set action scenarios in another example. In a specific example, there is a low probability that states indicating "Run", "Vehicle", and "Bicycle" are recognized as the user's state in a case in which a user's situation of doing a desk work is assumed.

In view of such a situation, the function map may be set such that a part of the series of candidates related to the user's state set in advance is excluded from the target of determination related to control of audio output in at least a part of the action scenarios, for example.

For example, FIG. 18 is an explanatory diagram for describing an outline of the information processing system according to Modification Example 2-2 and illustrates an example of a preset of function maps on the assumption of a plurality of action scenarios. In the preset illustrated in FIG. 18, a plurality of action scenarios A to D is assumed, and function maps corresponding to the respective action scenarios are set. Specifically, the action scenario A represents an example of an action scenario on the assumption of utilization during commute to work and going to school. Also, the action scenario B represents an example of an action scenario on the assumption of utilization during exercising such as walking. Also, the action scenario C represents an example of an action scenario on the assumption of utilization during working such as a desk work. Also, the action scenario D represents an example of an action scenario on the assumption of utilization when the user concentrates on his/her hobby. Note that in each function map illustrated in FIG. 18, corresponding items of control are hatched for candidates excluded from the target of the determination related to control of audio output from among the series of candidates for the user's state.

In a specific example, the state indicating "Bicycle" is excluded from the target of determination related to control of audio output in any of the function maps respectively corresponding to the action scenarios A to D in consideration of safety when riding a bicycle in the example illustrated in FIG. 18.

Next, the action scenario A will be described. Since the action scenario A assumes utilization during commute to work and going to school, there is a low probability that the state in which the user is constantly stopping for taking a break is recognized. Therefore, in the function map corresponding to the action scenario A, the state indicating "Long Stay" is excluded from the target of determination related to control of audio output.

Next, the action scenario B will be described. Since the action scenario B assumes utilization during exercising such as walking, there is a low probability that the state in which the user is moving on transportation such as a bus or a train is recognized. Therefore, in the function map corresponding to the action scenario B, the state indicating "Vehicle" is excluded from the target of determination related to control of audio output. In addition, there may be a case in which more desirable setting content differs for the state in which the user is temporarily stopping to wait for a signal or the like and a case in which the user is constantly stopping to take a break during walking or the like. Therefore, in the function map corresponding to the action scenario B, "Stay" and "Long Stay" are explicitly distinguished, and different settings are applied to the respective states. More specifically, although the setting for the previous state is taken over even if the state indicating "Stay" is recognized, the noise reduction function and the ambient function are explicitly controlled in a case in which the state indicating "Long Stay" is recognized.

Next, the action scenario C will be described. Since the action scenario C assumes utilization during working such as a desk work, there is a low probability that the state in which the user is moving on transportation such as a bus or a train or a state in which the user is running and moving is recognized. Therefore, in the function map corresponding to the action scenario C, the states respectively indicating "Run" and "Vehicle" are excluded from the target of determination related to control of audio output. In addition, the state in which the user is temporarily stopping and the state in which the user is constantly stopping are respectively explicitly distinguished even in the action scenario C. That is, in the function map corresponding to the action scenario C, "Stay" and "Long Stay" are explicitly distinguished, and different settings are applied to the respective states.

Next, the action scenario D will be described. Since the action scenario D assumes a situation in which the user is concentrating on his/her hobby, there is a low probability that the state in which the user is moving on transportation such as a bus or a train and the state in which the user is running and moving is recognized similarly to the action scenario C. Therefore, in the function map corresponding to the action scenario D, the states respectively indicating "Run" and "Vehicle" are excluded from the target of determination related to control of audio output. In addition, since the action scenario D assumes a situation in which the user is concentrating on one task, "Stay" and "Long Stay" are not explicitly distinguished, and the state is recognized as "Stay". Also, in the function map corresponding to the action scenario D, settings for activating the noise reduction function and deactivating the ambient function are made in order for the user to be able to further enjoy the audio content or the like in a case in which the state indicating "Stay" is recognized.

Note that a setting regarding whether or not at least a part of candidates is to be excluded from the target of determination related to control of audio output may be set in advance as a preset as illustrated in FIG. 18, for example. In addition, the aforementioned setting regarding whether or not at least a part of candidates is to be excluded from the aforementioned target of determination may be changed on the basis of a user input provided via a predetermined input unit in another example. Also, the setting may dynamically be changed such at least a part of the candidates is to be excluded from the aforementioned target of determination on the basis of a predetermined condition in another example. In a more specific example, the information processing device 10 may specify a country where the user is located on the basis of position information acquired by a GPS or the like and update the setting such that a part of the candidates is excluded from the aforementioned target of determination in accordance with law regulation of the specified country.

Note that in a case in which a recognized user's state is excluded from the target of determination related to control of audio output in the function map selected in accordance with the action scenario, it is only necessary for the information processing device 10 to perform control such that the previous state is taken over as a setting related to control of audio output.

The example of the case in which a part of the candidates for the user's state set in advance is excluded from the target of determination related to control of audio output in accordance with the predetermined condition has been described above as Modification Example 2-2 with reference to FIG. 18.

Modification Example 2-3: Control Using Detection Results of Plurality of Types of States and Situations Next, an example of a mechanism for improving precision of recognizing a user's state using detection results of a plurality of types of states and situations will be described as Modification Example 2-3 with reference to FIGS. 19 to 23. FIGS. 19 to 23 are explanatory diagrams for describing operations of the information processing system according to Modification Example 2-3.

As described above, it is possible to use detection results obtained by a variety of types of detection units 103 such as various sensors (for example, an acceleration sensor and an angular speed sensor (gyro)), and a GPS in order to recognize the user's state. On the basis of such a configuration, the information processing system according to Modification Example 2-3 improves accuracy of recognizing the user's state by selectively combining and using the detection results of various states and situations obtained by the variety of types of detection units 103.

Figure 19:
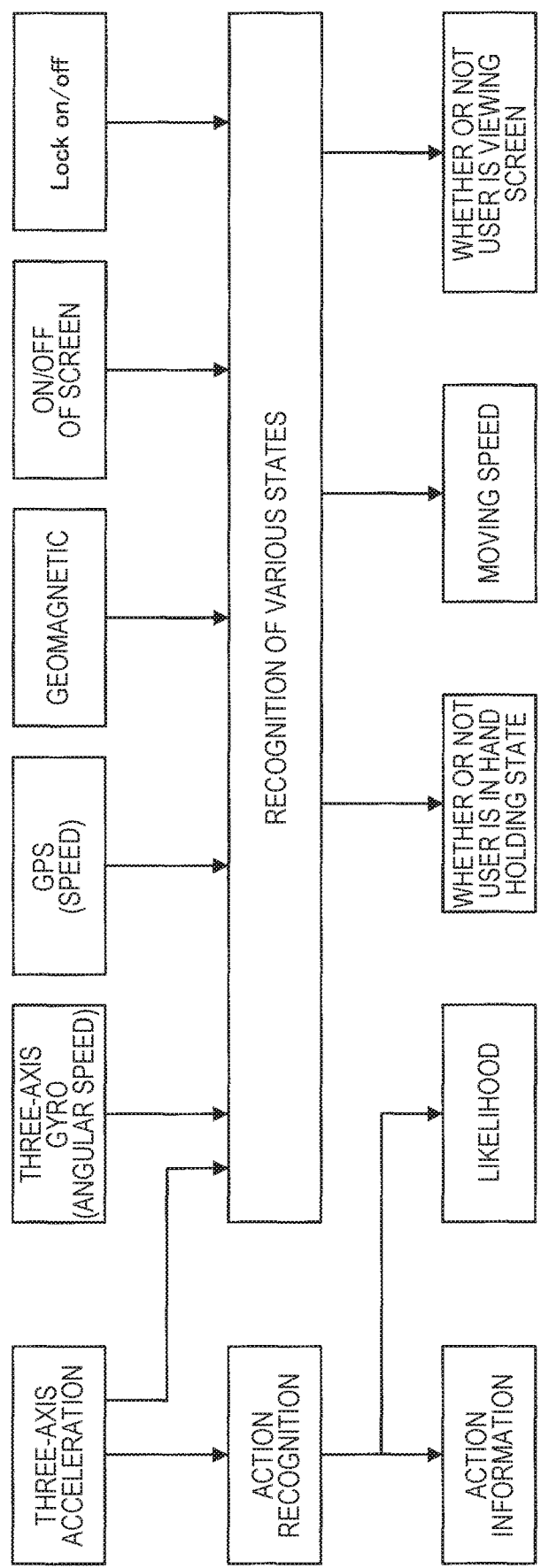
FIG. 19 is an explanatory diagram for describing operations of an information processing system according to a modification example 2-3.
Figure 20:
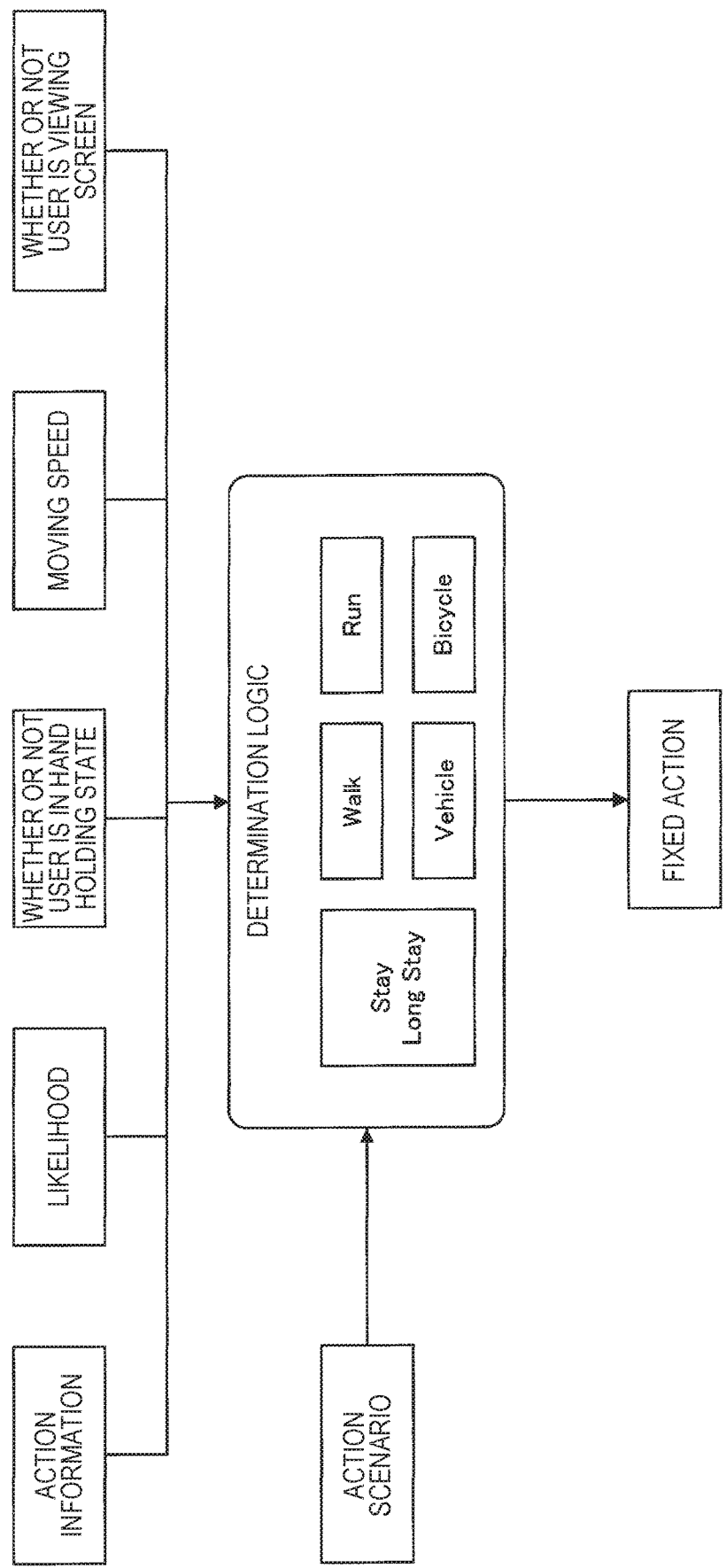
FIG. 20 is an explanatory diagram for describing operations of an information processing system according to the modification example 2-3.

For example, FIGS. 19 and 20 illustrate an outline of processing related to recognition of the user's state using the information processing system according to Modification Example 2-3.

As illustrated in FIG. 19, for example, the information processing device 10 recognizes a user's state (in particular, a state related to a user's action) on the basis of a detection result of acceleration applied to the information processing device 10 that is obtained by a three-axis acceleration sensor in the information processing system according to Modification Example 2-3. Then, the information processing device 10 acquires action information indicating the user's state and information indicating a likelihood of the user's state on the basis of the recognition result.

In addition, the information processing device 10 acquires information indicating various states or situations by using a detection result obtained by a different detection unit in addition to the detection result obtained by the acceleration sensor in the information processing system according to Modification Example 2-3. In the example illustrated in FIG. 19, for example, the information processing device 10 uses detection results obtained by a three-axis angular speed sensor (gyro), a GPS, a geomagnetic sensor, and the like. In addition, the information processing device 10 may acquire information indicating a state of ON/OFF of a screen (that is, display/non-display), ON/OFF of a lock for restricting input and output of information, and the like by using a system call such as an operation system (OS) or the like.

Note that the frequencies of detection (for example, sampling rates) of the respective detection units may be individually set for the respective detection units. In a specific example, the sampling rates of the acceleration sensor and the angular speed sensor may be different from the sampling rate of the GPS. In addition, the frequencies at which the states or situations are detected may be set in accordance with properties of the states or situations as targets of detection of the respective detection units. For a state that changes a relatively low frequency, such as ON/OFF of the screen, ON/OFF of the lock, or the like, for example, the detection frequency (in other words, the sampling rate) of the state may be set to be lower than detection frequency of the other states.

In addition, in a case in which the detection frequency of at least a part of the plurality of detection units is different from the detection frequencies of the other detection units, the information processing device 10 may control the frequencies (timings) at which the respective states or situations are recognized such that the timings at which the respective states or situations are recognized on the basis of the detection results obtained by the respective detection units are synchronized. In a specific example, the information processing device 10 may set the frequencies at which the respective states or situations are recognized on the basis of the detection results obtained by the plurality of respective detection units in accordance with the lowest detection frequency from among the detection frequencies of the plurality of respective detection units. Note that in this case, there may be a case in which a plurality of samples is acquired for the detection result obtained by the detection unit with a high detection frequency until the detection result is acquired by the detection unit with a low detection frequency. In such a case, the information processing device 10 may calculate information acquired as the detection result of the detection unit with the high detection frequency on the basis of the plurality of samples acquired by the detection unit. In a specific example, the information processing device 10 may acquire an average value of the plurality of samples of the plurality of samples acquired by the detection unit with the high detection frequency and acquire the calculated average value as the detection result obtained by the detection unit.

Then, the information processing device 10 recognizes various states or situations such as whether or not the user is holding the information processing device 10 in his/her hand, information indicating a user's moving speed, whether or not the user is viewing the screen, and the like, for example, on the basis of the acquired various kinds of information.

In a specific example, it is possible to determine whether or not the user is in the state in which the user is holding the information processing device 10 in his/her hand (that is, a hand holding state) on the basis of detection results of changes in the position or the orientation of the information processing device 10 obtained by the acceleration sensor or the angular speed sensor. In addition, it is possible to detect the user's moving speed by monitoring the detection result of position information obtained by the GPS. In addition, it is also possible to estimate whether or not the user is viewing the screen by using a detection result of ON/OFF of the screen and a detection result of ON/OFF of the lock. Specifically, it is possible to estimate that the user is in the state of viewing the screen in a case in which the screen is in the ON state and the lock is in the lock OFF state.

Then, the information processing device 10 fixes the user's state on the basis of the action information and the likelihood acquired on the basis of the detection result obtained by the acceleration sensor and the results of recognizing various states or situations acquired on the basis of the detection results obtained by the plurality of detection units. In the example illustrated in FIG. 19, for example, the information processing device 10 fixes the user's state on the basis of a predetermined determination logic using, as input, the acquired action information, the likelihood, the information indicating whether or not the user is in the hand holding state, the moving speed, the information indicating whether or not the user is in the state of viewing the screen, and the action scenario selected in advance. In a specific example, the information processing device 10 may fix the result of recognizing the user's state by correcting the user's state indicated by the action information on the basis of the results of recognizing the various states or situations acquired on the basis of the detection results obtained by the plurality of detection units.

Note that in the example illustrated in FIGS. 19 and 20, the information processing device 10 may use the detection results obtained by the detection units other than the acceleration sensor only in a case in which the action information acquired on the basis of the detection result obtained by the acceleration sensor indicates a predetermined candidate from among the series of candidates for the user's state. In this case, the information processing device 10 may activate a different detection unit and may correct the result of recognizing the user's state indicated by the action information on the basis of the results of recognizing various states or situations in accordance with the detection result obtained by the detection unit in a case in which the acquired action information indicates a predetermined candidate.

Figure 21:
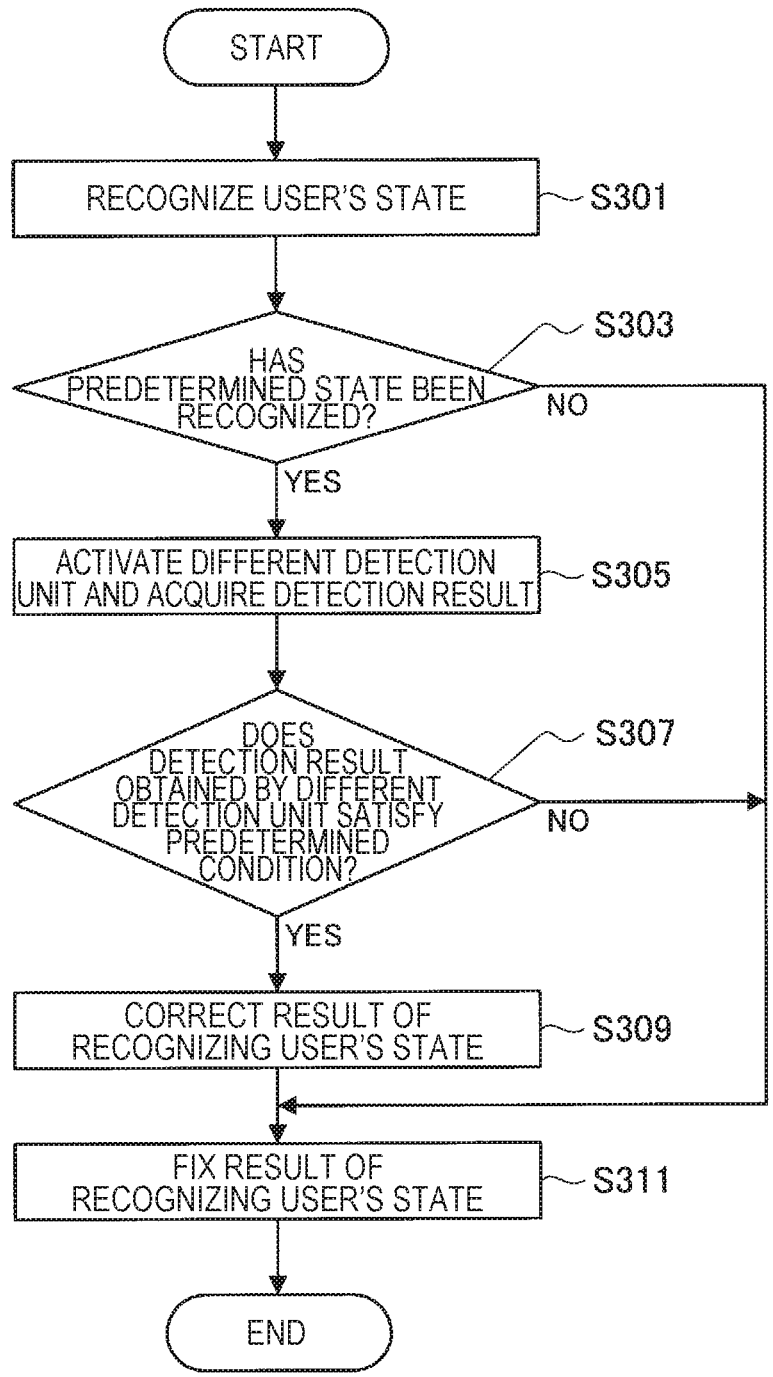
FIG. 21 is an explanatory diagram for describing operations of an information processing system according to the modification example 2-3.

Here, an example of a flow of processing of the information processing device 10 recognizing a user's state (a state related to a user's action, in particular) in accordance with a result of recognizing various states or situations acquired on the basis of the detection results obtained by a plurality of detection units will be described with reference to FIG. 21. FIG. 21 is a flowchart illustrating an example of a flow of a series of processing of the information processing device 10 according to Modification Example 2-3.

For example, the information processing device 10 recognizes a user's state on the basis of a detection result of a three-axis acceleration applied to the information processing device 10 that is obtained by an acceleration sensor (S301).

Then, the information processing device 10 determines whether or not the result of recognizing the user's state indicates a predetermined candidate from among the series of candidates for the user's state (S303). In a case in which the result of recognizing the user's state indicates the predetermined candidate (that is, in a case in which a predetermined state is recognized) (YES in S303), the information processing device 10 activates a different detection unit (for example, an angular speed sensor, a GPS, or the like) that is different from the acceleration sensor and acquires a detection result obtained by the different detection unit (S305). In a case in which a result of recognizing a predetermined state or situation in accordance with the detection result obtained by the different detection unit satisfies a predetermined condition (YES in S307), the information processing device 10 corrects the result of recognizing the user's state based on the detection result obtained by the acceleration sensor on the basis of the result of recognizing the predetermined state or situation (S309). Then, the information processing device 10 fixes the result of recognizing the user's state after the correction as a final result of recognizing the user's state (S311).

Meanwhile, in a case in which the result of recognizing the predetermined state or situation in accordance with the detection result obtained by the different detection unit does not satisfy the predetermined condition (NO in S307), the information processing device 10 fixes the result of recognizing the user's state based on the detection result obtained by the acceleration sensor as a final result of recognizing the user's state (S311). Also, in a case in which the result of recognizing the user's state based on the detection result obtained by the acceleration sensor does not indicate a predetermined candidate (NO in S303), the information processing device 10 fixes the result of recognizing the user's state as a final result of recognizing the user's state (S311).

As described above, the information processing device 10 according to Modification Example 2-3 can improve accuracy of recognizing the user's state by correcting the result of recognizing the user's state based on the detection result obtained by the acceleration sensor, for example, on the basis of the result of recognizing various states or situations in accordance with the detection result obtained by the different detection unit.

In a more specific example, the information processing device 10 may recognize a moving speed of the user on the basis of a detection result obtained by a GPS in a case in which "Vehicle" is recognized as a user's state on the basis of the detection result obtained by the acceleration sensor. In this case, the information processing device 10 may fix the user's state as "Vehicle" in a case in which the result of recognizing the moving speed of the user exceeds a predetermined speed, for example. In addition, the information processing device 10 may activate the angular speed sensor and determines whether or not the user is in the hand holding state on the basis of the respective detection results obtained by the acceleration sensor and the angular speed sensor in a case in which "Vehicle" is recognized as the user's state on the basis of the detection result obtained by the acceleration sensor in another example. In this case, the information processing device 10 may fix the user's state as "Vehicle" in a case in which it is determined that the user is not in the hand holding state, for example.

Next, an example of an operation in a case in which the information processing device 10 activates a different detection unit and fixes a final result of recognizing a user's state on the basis of a detection result obtained by the different detection unit in a case in which the result of recognizing the user's state based on a detection result obtained by a predetermined detection unit indicates a predetermined candidate will be described with reference to FIGS. 22 and 23.

Figure 22:
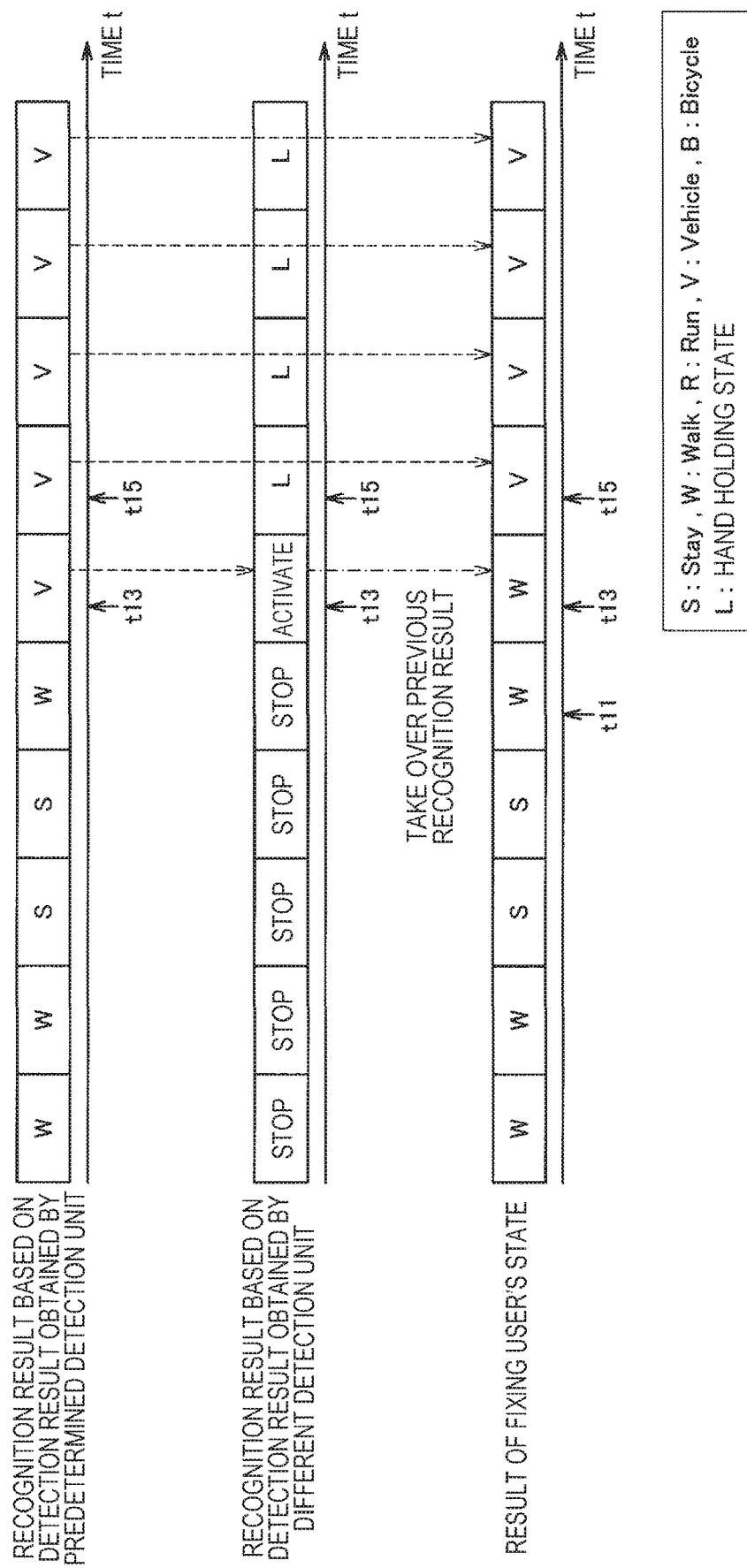
FIG. 22 is an explanatory diagram for describing operations of an information processing system according to the modification example 2-3.

For example, FIG. 22 illustrates a case in which the information processing device 10 recognizes a different state by activating a different detection unit and fixing a final user's state in accordance with the recognition result in a case in which a detection result obtained by a predetermined detection unit indicates "Vehicle". Note that the horizontal axis in FIG. 22 represents a time t. Also, in the example illustrated in FIG. 22, the information processing device 10 recognizes the user's state based on the detection result obtained by the predetermined detection unit and recognizes the different state based on the detection result obtained by the different detection unit every predetermined unit time. In a more specific example, the information processing device 10 may apply an acceleration sensor as the predetermined detection unit and recognize the user's state on the basis of a detection result obtained by the acceleration sensor. Also, the information processing device 10 may apply an angular speed sensor as the different detection unit and determines whether or not the user is in the hand holding state on the basis of the respective detection results obtained by the aforementioned acceleration sensor and the angular speed sensor. For example, "L" means the state in which the user is in the hand holding state in FIG. 22.

Specifically, in the example illustrated in FIG. 22, the information processing device 10 recognizes that the user's state transitions to the state indicating "Vehicle" at a timing represented by the reference numeral t13, and the state indicating "Vehicle" continues at and after the timing t13. In this case, the information processing device 10 activates the different detection unit at the timing t13 and causes the different detection unit to start to acquire information for recognizing a different state. More specifically, the information processing device 10 activates the angular speed sensor at the timing t13 and starts to determine whether or not the user is in the hand holding state on the basis of the respective detection results of the aforementioned acceleration sensor and the activated angular speed sensor in the example illustrated in FIG. 22.

Note that since the different detection unit is activated at the timing t13, the result of recognizing the different state based on the detection result obtained by the different detection unit can be acquired at or after a timing t15 that is reached after at least a unit time elapses from the timing t13. That is, it is difficult for the information processing device 10 to cause the user's state to be fixed on the basis of the result of recognizing the different state based on the detection result obtained by the different detection unit at the timing t13. Therefore, the information processing device 10 takes over the result of recognizing the user's state at a timing t11 that is reached before the timing t13, as the user's state at the timing t13 in the example illustrated in FIG. 22. That is, in the example illustrated in FIG. 22, the information processing device 10 fixes the user's state at the timing t13 as a state indicating "Walk" that is recognized at the timing t11.

Note that at and after the timing t15, the information processing device 10 recognizes a different state on the basis of the detection result obtained by the different detection unit and fixes the final user's state on the basis of the recognition result. In the example illustrated in FIG. 22, for example, the information processing device 10 fixes the final user's state as the state indicating "Vehicle" that is recognized on the basis of the detection result obtained by the predetermined detection unit in accordance with the result of recognizing the different state based on the detection result obtained by the different detection unit. In a more specific example, in a case in which the state in which the user is in the hand holding state is recognized on the basis of a detection result obtained by an angular speed sensor activated as the different detection unit, the information processing device 10 fixes the final user's state as the state indicating "Vehicle" recognized on the basis of the detection result obtained by the acceleration sensor.

Next, an example of an operation of causing the different detection unit to stop after the different detection unit is activated as in the example illustrated in FIG. 22 using the information processing device 10 will be described with reference to FIG. 23. Note that the horizontal axis in FIG. 23 represents a time t similarly to the example illustrated in FIG. 22. In addition, the information processing device 10 recognizes the user's state based on the detection result obtained by the predetermined detection unit and recognizes the different state based on the detection result obtained by the different detection unit at a predetermined unit time in the example illustrated in FIG. 23.

Figure 23:
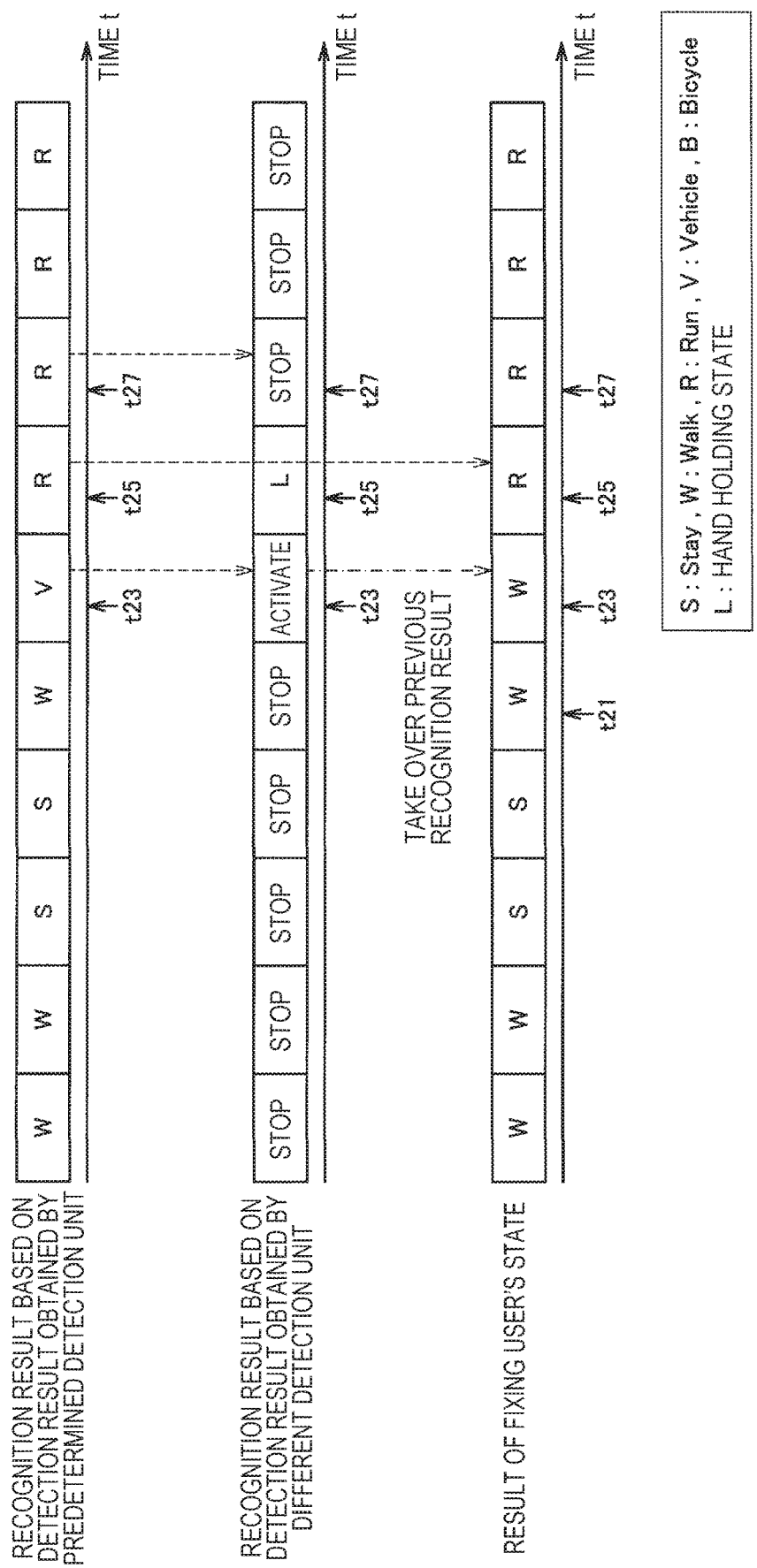
FIG. 23 is an explanatory diagram for describing operations of an information processing system according to the modification example 2-3.

In the example illustrated in FIG. 23, the information processing device 10 recognizes that the user's state has transitioned to the state indicating "Vehicle" at the timing represented with the reference numeral t23. That is, the information processing device 10 activates the different detection unit at the timing t23 and causes the different detection unit to start to acquire information for recognizing the different state.

Note that it is difficult for the information processing device 10 to fix the user's state on the basis of the result of recognizing the different state based on the detection result obtained by the different detection unit at the timing t23 similarly to the example illustrated in FIG. 22. Therefore, the information processing device 10 takes over the result of recognizing the user's state at the timing t12 before the timing t23 (that is, the state indicating "Walk") as the user's state at the timing t23.

Meanwhile, in the example illustrated in FIG. 23, the information processing device 10 recognizes that the user's state has transitioned to the state indicating "Run" at the timing t25 after the timing t23, and the state indicating "Run" continues at and after the timing t25. In this case, the information processing device 10 uses, as a reference point, the timing t25 at which the result of recognizing the user's state based on the detection result obtained by the predetermined detection unit has transitioned to the different state other than "Vehicle" and stops the different detection unit (for example, the angular speed sensor) that is being activated at a timing t27 after the timing t25. That is, the information processing device 10 fixes the result of recognizing the user's state obtained by the predetermined detection unit (for example, the acceleration sensor) as the final result of recognizing the user's state at and after the timing t27 at which the different detection unit stops.

As described above, the information processing device 10 according to Modification Example 2-3 fixes the final result of recognizing the user's state by combining the result of recognizing the user's state based on the detection unit obtained by the predetermined detection unit and the result of recognizing the predetermined state or situation based on the detection result obtained by the different detection unit. With such a configuration, the information processing device 10 according to Modification Example 2-3 can improve accuracy of recognizing the user's state.

In addition, the information processing device 10 according to Modification Example 2-3 may activate the different detection unit and fix the final result of recognizing the user's state on the basis of the detection result obtained by the different detection unit in a case in which the result of recognizing the user's state based on the detection result obtained by the predetermined detection unit indicates a predetermined candidate. With such a configuration, the information processing device 10 can activate the different detection unit in order to improve accuracy of recognizing a predetermined state only in a case in which the state has been detected. Therefore, the information processing system according to Modification Example 2-3 can reduce power consumption since it is not necessary to constantly activate a part of the detection units.

The example of the mechanism for improving the accuracy of recognizing the user's state using the detection results of a plurality of types of states or situations has been described above as Modification Example 2-3 with reference to FIGS. 19 to 23.

<3.6. Evaluation>

As described above, the information processing device 10 selects an action scenario in accordance with a predetermined condition in the information processing system according to the embodiment. For example, the information processing device 10 selects an action scenario that is more suitable to the situation of the moment in accordance with information related to a selection condition of the action scenario such as a detection result of various states or situations, user's attribute information, and the like. Also, the information processing device 10 may select the action scenario on the basis of a user input provided via a predetermined input unit in another example. In addition, the information processing device 10 recognizes the user's state in accordance with the detection result of the predetermined state or situation. Then, the information processing device 10 controls operations (in particular, the setting related to control of audio output) of the audio device 30 in accordance with the function map corresponding to the selected action scenario and the result of recognizing the user's state. With such a configuration, the information processing device 10 can control the operations of the audio device 30 in a more suitable mode in accordance with the situation of the moment by appropriately switching the function map in accordance with the action scenario (in other words, a use case) on the assumption of the user's action.

Note that the example of the configuration and the control described above in the first embodiment can similarly be applied to the information processing system according to the embodiment. In a specific example, the examples of the configurations and the control described as Modification Examples 1-1 to 1-3 of the first embodiment can similarly be applied to the information processing system according to the embodiment.

4. Hardware Configuration

Figure 24:
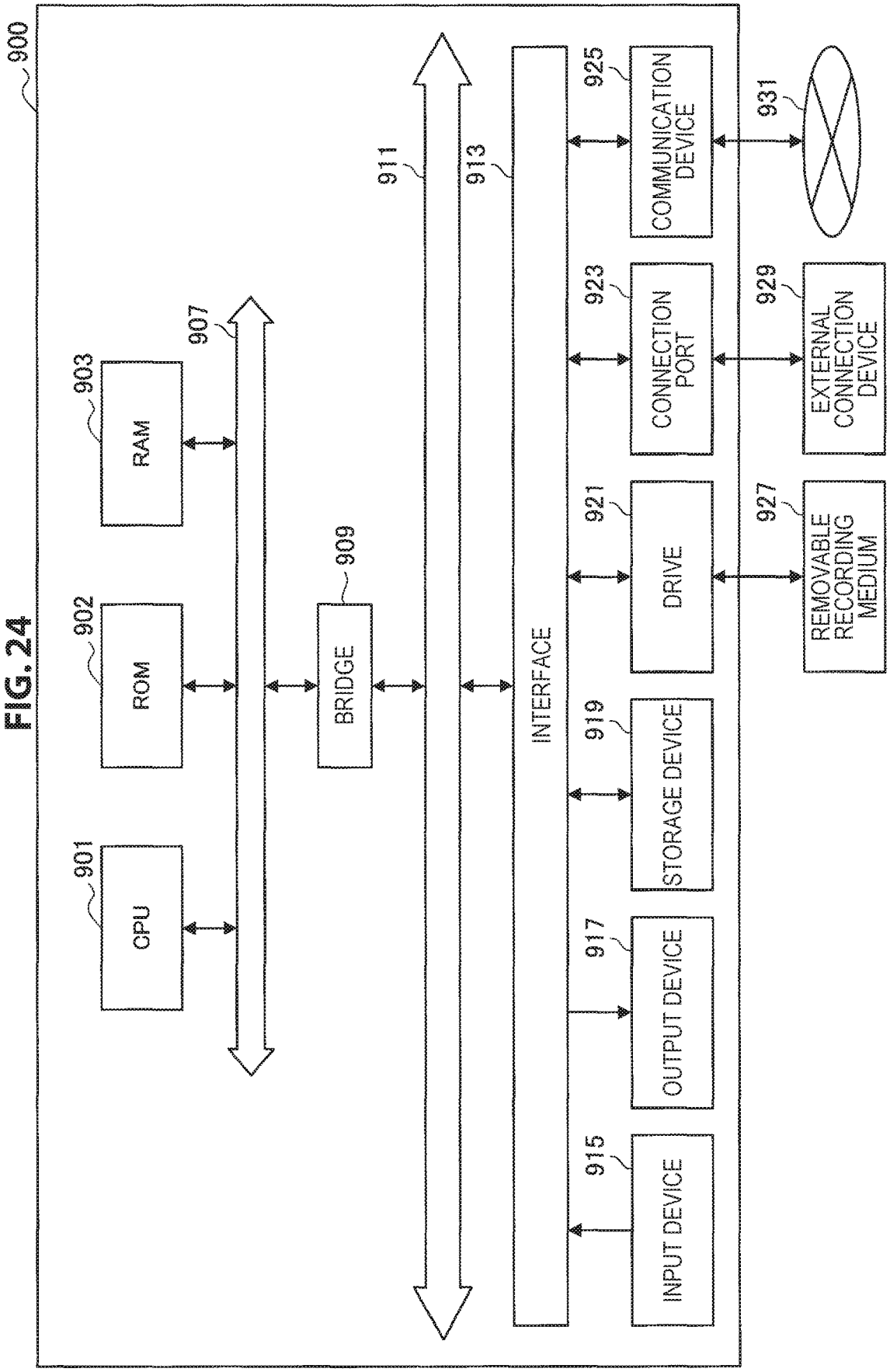
FIG. 24 is a block diagram illustrating an example of a hardware configuration of an information processing device according to an embodiment of the present disclosure.

Next, like the information processing devices 10 and 10a described above, a hardware configuration of an information processing device 900 included in the information processing system according to each embodiment of the present disclosure will be described in detail with reference to FIG. 24. FIG. 24 is a function block diagram illustrating an example of the hardware configuration of the information processing device included in the information processing system according to the present embodiment of the present disclosure.

The information processing device 900 included in the information processing system according to the present embodiment mainly includes a CPU 901, a ROM 903, and a RAM 905. Furthermore, the information processing device 900 also includes a host bus 907, a bridge 909, an external bus 911, an interface 913, an input device 915, an output device 917, a storage device 919, a drive 921, a connection port 923, and a communication device 925.

The CPU 901 serves as an arithmetic processing device and a control device, and controls the overall operation or a part of the operation of the information processing device 900 according to various programs recorded in the ROM 903, the RAM 905, the storage device 919, or a removable recording medium 927. The ROM 903 stores programs, operation parameters, and the like used by the CPU 901. The RAM 905 primarily stores programs that the CPU 901 uses and parameters and the like varying as appropriate during the execution of the programs. These are connected with each other via the host bus 907 including an internal bus such as a CPU bus or the like. Note that the recognition processing unit 105 and the output control unit 107 described above with reference to FIG. 5 and the scenario selection unit 113 described above with reference to FIG. 8 can be realized by the CPU 901, for example.

The host bus 907 is connected to the external bus 911 such as a peripheral component interconnect/interface) (PCI) bus via the bridge 909. Additionally, the input device 915, the output device 917, the storage device 919, the drive 921, the connection port 923, and the communication device 925 are connected to the external bus 911 via the interface 913.

The input device 915 is an operation mechanism operated by a user, such as a mouse, a keyboard, a touch panel, buttons, a switch, a lever, or a pedal. Also, the input device 915 may be a remote control mechanism (a so-called remote control) using, for example, infrared light or other radio waves, or may be an external connection device 929 such as a mobile phone or a PDA conforming to the operation of the information processing device 900. Furthermore, the input device 915 generates an input signal based on, for example, information which is input by a user with the above operation mechanism, and includes an input control circuit for outputting the input signal to the CPU 901. The user of the information processing device 900 can input various data to the information processing device 900 and can instruct the information processing device 900 to perform processing by operating the input device 915. Note that the input unit 115 described above with reference to FIG. 8 can be realized by, for example, the input device 915.

The output device 917 includes a device capable of visually or audibly notifying acquired information to a user. Examples of such device include display devices such as a CRT display device, a liquid crystal display device, a plasma display device, an EL display device and lamps, audio output devices such as a speaker and a headphone, a printer, and the like. For example, the output device 917 outputs a result obtained by various processes performed by the information processing device 900. More specifically, the display device displays, in the form of texts or images, a result obtained by various processes performed by the information processing device 900. On the other hand, the audio output device converts an audio signal including reproduced audio data and sound data into an analog signal, and outputs the analog signal. Note that the output unit 109 described above with reference to FIG. 5 can be realized by, for example, the output device 917.

The storage device 919 is a device for storing data configured as an example of a storage unit of the information processing device 900. The storage device 919 is configured from, for example, a magnetic storage device such as a hard disk drive (HDD), a semiconductor storage device, an optical storage device, or a magneto-optical storage device. This storage device 919 stores programs to be executed by the CPU 901, and various data. Note that the storage unit 111 described above with reference to FIG. 5 can be realized by at least one of the RAM 905 or the storage device 919, for example.

The drive 921 is a reader/writer for recording medium, and is embedded in the information processing device 900 or attached externally thereto. The drive 921 reads information recorded in the attached removable recording medium 927 such as a magnetic disk, an optical disc, a magneto-optical disk, or a semiconductor memory, and outputs the read information to the RAM 905. Furthermore, the drive 921 can write record in the attached removable recording medium 927 such as a magnetic disk, an optical disc, a magneto-optical disk, or a semiconductor memory. The removable recording medium 927 is, for example, a DVD medium, an HD-DVD medium, or a Blu-ray (a registered trademark) medium. In addition, the removable recording medium 927 may be a CompactFlash (CF; a registered trademark), a flash memory, a secure digital (SD) memory card, or the like. Alternatively, the removable recording medium 927 may be, for example, an integrated circuit (IC) card equipped with a non-contact IC chip or an electronic appliance.

The connection port 923 is a port for allowing devices to directly connect to the information processing device 900. Examples of the connection port 923 include a universal serial bus (USB) port, an IEEE1394 port, a small computer system interface (SCSI) port, and the like. Other examples of the connection port 923 include an RS-232C port, an optical audio terminal, a high-definition multimedia interface (HDMI) (a registered trademark) port, and the like. By the external connection device 929 connecting to this connection port 923, the information processing device 900 directly obtains various types of data from the external connection device 929 and provides various types of data to the external connection device 929.

The communication device 925 is a communication interface including, for example, a communication device for connecting to a communication network 931. The communication device 925 is, for example, a wired or wireless local area network (LAN), Bluetooth (registered trademark), a communication card for WUSB (Wireless USB), or the like. Alternatively, the communication device 925 may be a router for optical communication, a router for asymmetric digital subscriber line (ADSL), a modem for various communications, or the like. This communication device 925 can transmit and receive signals and the like in accordance with a predetermined protocol such as TCP/IP on the Internet and with other communication devices, for example. The communication network 931 connected to the communication device 925 includes a network and the like, which is connected via wire or wirelessly, and may be, for example, the Internet, a home LAN, infrared communication, radio wave communication, satellite communication, or the like. Note that the communication unit 101 described above with reference to FIG. 5 can be realized by the communication device 925, for example.

Heretofore, an example of the hardware configuration capable of realizing the functions of the information processing device 900 included in the information processing system according to the embodiment of the present disclosure has been shown. Each of the structural elements described above may be configured using a general-purpose material, or may be implemented by hardware dedicated to the function of each structural element. Accordingly, the hardware configuration to be used can be changed as appropriate according to the technical level at the time of carrying out the present embodiment. Note that, although not shown in FIG. 24, for example, it naturally includes various configurations corresponding to the information processing device 900 included in the information processing system according to the present embodiment.

Note that it is also possible to develop a computer program for realizing the respective functions of the information processing device 900 included in the information processing system according to the present embodiment as discussed above, and implement the computer program in a personal computer or the like. In addition, a computer-readable recording medium storing such a computer program may also be provided. The recording medium may be a magnetic disk, an optical disc, a magneto-optical disk, or flash memory, for example. Furthermore, the above computer program may also be delivered via a network, for example, without using a recording medium. In addition, the number of computers causing the computer program to be executed is not particularly limited. For example, the computer program may be executed in cooperation of a plurality of computers (e.g., a plurality of servers or the like). Note that a single computer or a plurality of cooperating computers is also referred to as "computer system."

5. Conclusion

The preferred embodiment (s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An information processing device including:

a recognition processing unit that recognizes a user's state in accordance with a detection result of a predetermined state or situation; and an output control unit that controls audio output from a predetermined output unit on the basis of a function map, which is selected in accordance with a predetermined condition, in which a setting related to control of the audio output is associated with each of a plurality of candidates for the user's state, and the recognized user's state.

(2)

The information processing device according to (1), in which, in the function map, a combination of settings related to each of a plurality of types of control is associated as the setting related to the control of the audio output for each of the plurality of candidates for the user's state.

(3)

The information processing device according to (2), in which at least a part of the settings related to the plurality of types of control is a setting of a function related to control of the audio output.

(4)

The information processing device according to any one of (1) to (3), in which the user's state is a state related to the user's action.

(5)

The information processing device according to any one of (1) to (4), in which, in a case in which a predetermined state has been recognized as the user's state, the output control unit takes over at least a part of the settings related to the control of the audio output in another state before transition to the predetermined state.

(6)

The information processing device according to (5), in which the predetermined state is a state in which the user is still.

(7)

The information processing device according to (5), in which the predetermined state is a state in which the user is riding a bicycle.

(8)

The information processing device according to any one of (1) to (4), in which, in a case in which the user's state has transitioned, the output control unit controls the audio output in accordance with states before and after the transition.

(9)

The information processing device according to any one of (1) to (8), in which the recognition processing unit recognizes the user's state in accordance with likelihood of each of one or more candidates for the user's state based on the detection result.

(10)

The information processing device according to any one of (1) to (9), in which the recognition processing unit recognizes the user's state in accordance with a result of machine learning based on a sample that associates the detection result acquired in the past and a result of recognizing the user's state in accordance with the detection result.

(11)

The information processing device according to any one of (1) to (10), including:

a selection unit that employs, as the condition, at least one of a detection result of a predetermined state or situation or attribute information of a predetermined target and selects the function map in accordance with the condition from a plurality of the function maps.

(12)

The information processing device according to (11), in which the selection unit selects the function map in accordance with a result of machine learning based on a sample that associates the condition determined in the past and a result of selecting the function map in accordance with the condition.

(13)

The information processing device according to any one of (1) to (10), in which the output control unit controls the audio output in accordance with the recognized user's state on the basis of the function map selected by the user.

(14)

The information processing device according to any one of (1) to (13), in which at least a part of a plurality of the function maps is updated on the basis of a user input.

(15)

The information processing device according to any one of (1) to (14), in which the recognition processing unit corrects a result of recognizing the user's state based on a first detection result of a predetermined state or situation obtained by a first detection unit in accordance with a second detection result of a predetermined state or situation obtained by a second detection result that is different from the first detection unit.

(16)

The information processing device according to (15), in which the recognition processing unit activates the second detection unit in accordance with the result of recognizing the user's state based on the first detection result.

(17)
  The information processing device according to (16),
  in which the recognition processing unit
    activates the second detection unit in a case in which the result of recognizing the user's state based on the first detection result indicates a predetermined state, and
    stops the second detection unit in a case in which the user's state based on the first detection result indicates a state other than the predetermined state after activating the second detection unit.
(18)
  The information processing device according to (16) or (17), in which the recognition processing unit corrects the result of recognizing the user's state based on the first detection result in accordance with the second detection result obtained by the second detection unit at a timing later than a timing at which the second detection unit is activated.
(19)
  An information processing method including, by a computer:
    recognizing a user's state in accordance with a detection result of a predetermined state or situation; and
    controlling audio output from a predetermined output unit on the basis of a function map, which is selected in accordance with a predetermined condition, in which a setting related to control of the audio output is associated with each of a plurality of candidates for the user's state, and the recognized user's state.
(20)
  A program that causes a computer to execute:
    recognizing a user's state in accordance with a detection result of a predetermined state or situation; and
    controlling audio output from a predetermined output unit on the basis of a function map, which is selected in accordance with a predetermined condition, in which a setting related to control of the audio output is associated with each of a plurality of candidates for the user's state, and the recognized user's state.

REFERENCE SIGNS LIST 1, 1a information processing system
10, 10a information processing device
101 communication unit
103 detection unit
105 recognition processing unit
107 output control unit
109 output unit
111 storage unit
113 scenario selection unit
115 input unit
30 audio device
301 communication unit
303 audio output unit
305 control unit
307 signal processing unit
311 case body
312 headband
321 microphone
322 microphone
331 signal processing circuit
332 equalizer
333 adder
334 power amplifier
341 sound generation element

The invention claimed is:

1. A method of controlling an audio device, the method comprising:
  acquiring, with a processor of an information processing device, information related to a selection condition of an action scenario;
  estimating, with the processor, a user's action based on the acquired information related to the selection condition;
  recognizing, with the processor, a state of the user;
  determining, with the processor, a setting related to audio output of the audio device by comparing a function map selected based on the action scenario with the recognized state of the user; and
  transmitting a control command associated with the setting to the audio device.

2. The method of claim 1, wherein the function map comprising a combination of settings related to each of a plurality of types of control associated with control of the audio output for each of a plurality of candidates for the state of the user.

3. The method of claim 2, wherein at least a part of the settings related to the plurality of types of control is a setting of a function related to control of the audio output.

4. The method of claim 1, wherein the state of the user is related to an action of the user.

5. The method of claim 1, wherein the state of the user is a state in which the user is still.

6. The method of claim 1, wherein the state of the user is a state in which the user is riding a bicycle.

7. The method of claim 1, wherein the control command controls the audio output in accordance with the recognized state of the user on a basis of the function map.

8. A system comprising:
  a processor; and
  a computer-readable storage medium storing computer-readable instructions which, when executed by the processor, cause the processor to:
    acquire information related to a selection condition of an action scenario;
    estimate a user's action based on the acquired information related to the selection condition;
    recognize a state of the user;
    determine a setting related to audio output of the audio device by comparing a function map selected based on the action scenario with the recognized state of the user; and
    transmit a control command associated with the setting to the audio device.

9. The system of claim 8, wherein the function map comprising a combination of settings related to each of a plurality of types of control associated with control of the audio output for each of a plurality of candidates for the state of the user.

10. The system of claim 9, wherein at least a part of the settings related to the plurality of types of control is a setting of a function related to control of the audio output.

11. The system of claim 8, wherein the state of the user is related to an action of the user.

12. The system of claim 8, wherein the state of the user is a state in which the user is still.

13. The system of claim 8, wherein the state of the user is a state in which the user is riding a bicycle.

14. The system of claim 8, wherein the control command controls the audio output in accordance with the recognized state of the user on a basis of the function map.

15. A computer program product comprising a non-transitory computer readable storage medium having computer readable program code embodied therewith, the computer readable program code configured, when executed by a processor, to:

acquire information related to a selection condition of an action scenario;

estimate a user's action based on the acquired information related to the selection condition;

recognize a state of the user;

determine a setting related to audio output of the audio device by comparing a function map selected based on the action scenario with the recognized state of the user; and transmit a control command associated with the setting to the audio device.

16. The computer program product of claim 15, wherein the function map comprising a combination of settings related to each of a plurality of types of control associated with control of the audio output for each of a plurality of candidates for the state of the user.

17. The computer program product of claim 16, wherein at least a part of the settings related to the plurality of types of control is a setting of a function related to control of the audio output.

18. The computer program product of claim 15, wherein the state of the user is related to an action of the user.

19. The computer program product of claim 15, wherein the state of the user is a state in which the user is still.

20. The computer program product of claim 15, wherein the state of the user is a state in which the user is riding a bicycle.

* * * * *